(12) United States Patent
Song et al.

(10) Patent No.: US 12,094,546 B2
(45) Date of Patent: Sep. 17, 2024

(54) NON-VOLATILE MEMORY WITH ZONE BASED PROGRAM SPEED ADJUSTMENT

(71) Applicant: SANDISK TECHNOLOGIES LLC, Addison, TX (US)

(72) Inventors: Yi Song, Santa Clara, CA (US); Jiahui Yuan, Fremont, CA (US); Yanjie Wang, Santa Clara, CA (US)

(73) Assignee: SanDisk Technologies LLC, Austin, TX (US)

( * ) Notice: Subject to any disclaimer, the term of this patent is extended or adjusted under 35 U.S.C. 154(b) by 161 days.

(21) Appl. No.: 17/589,789

(22) Filed: Jan. 31, 2022

(65) Prior Publication Data

US 2023/0245706 A1   Aug. 3, 2023

(51) Int. Cl.
| | |
|---|---|
| *G11C 16/04* | (2006.01) |
| *G11C 16/10* | (2006.01) |
| *G11C 16/24* | (2006.01) |
| *G11C 16/26* | (2006.01) |
| *G11C 16/30* | (2006.01) |
| *G11C 16/34* | (2006.01) |

(52) U.S. Cl.
CPC ........ *G11C 16/3459* (2013.01); *G11C 16/102* (2013.01); *G11C 16/24* (2013.01); *G11C 16/26* (2013.01); *G11C 16/30* (2013.01); *G11C 16/3404* (2013.01)

(58) Field of Classification Search
CPC ... G11C 16/3459; G11C 16/102; G11C 16/24; G11C 16/26; G11C 16/30; G11C 16/3404
See application file for complete search history.

(56) References Cited

U.S. PATENT DOCUMENTS

| | | |
|---|---|---|
| 6,888,758 B1 | 5/2005 | Hemink |
| 7,020,026 B2 | 3/2006 | Guterman |
| 7,035,146 B2 | 4/2006 | Hemink |
| 7,092,290 B2 | 8/2006 | Hemink |

(Continued)

FOREIGN PATENT DOCUMENTS

| | | |
|---|---|---|
| DE | 10 2018 106 11 | 12/2018 |
| WO | 2016209563 A1 | 12/2016 |

OTHER PUBLICATIONS

PCT International Search Report and Written Opinion dated Oct. 24, 2022, PCT Patent Application No. PCT/US2022/030409.

(Continued)

*Primary Examiner* — Min Huang
(74) *Attorney, Agent, or Firm* — Vierra Magen Marcus LLP

(57) ABSTRACT

In order to decrease the width of threshold voltage distributions of programmed memory cells without unreasonably increasing the time needed to complete programming, a non-volatile memory uses a zone based program speed adjustment. The non-volatile memory starts programming a first set of the non-volatile memory cells until a minimum number of memory cells of the first set of non-volatile memory cells reach a first threshold voltage. In response to the minimum number of memory cells reaching the first threshold voltage, the first set of non-volatile memory cells are categorized into zones/groups based on threshold voltage. The speed of programming is then adjusted differently for each zone/group and programming is completed for the first set of non-volatile memory cells.

17 Claims, 24 Drawing Sheets

(56) References Cited

U.S. PATENT DOCUMENTS

| | | |
|---|---|---|
| 7,139,198 B2 | 11/2006 | Guterman |
| 7,158,421 B2 | 1/2007 | Li |
| 7,177,199 B2* | 2/2007 | Chen .................. G11C 16/3454 |
| | | 365/185.11 |
| 7,206,235 B1 | 4/2007 | Lutze |
| 7,301,817 B2 | 11/2007 | Lee |
| 7,447,081 B2 | 11/2008 | Chan |
| 7,508,715 B2 | 3/2009 | Lee |
| 7,508,721 B2 | 3/2009 | Li |
| 7,688,638 B2 | 3/2010 | Hemink |
| 8,120,967 B2 | 2/2012 | Kang |
| 8,174,895 B2 | 5/2012 | Chen |
| 8,233,324 B2 | 7/2012 | Sharon |
| 8,432,740 B2 | 4/2013 | Li |
| 8,630,120 B2 | 1/2014 | She |
| 8,675,416 B2 | 3/2014 | Lee |
| 8,705,293 B2 | 4/2014 | She |
| 8,971,141 B2 | 3/2015 | Mui |
| 9,142,298 B2 | 9/2015 | Dong |
| 9,437,302 B2 | 9/2016 | Tseng |
| 9,443,606 B2 | 9/2016 | Dutta |
| 9,564,213 B2 | 2/2017 | Sun |
| 9,767,909 B1* | 9/2017 | Yip .................. G11C 16/26 |
| 10,014,063 B2 | 7/2018 | Tseng |
| 10,102,909 B2 | 10/2018 | Park |
| 10,381,095 B1 | 8/2019 | Date |
| 2006/0146610 A1 | 7/2006 | Takeuchi |
| 2013/0077409 A1 | 3/2013 | Shiino et al. |
| 2014/0198570 A1 | 7/2014 | Hsieh et al. |
| 2015/0055411 A1 | 2/2015 | Kim et al. |
| 2017/0110185 A1* | 4/2017 | Hahn .................. G11C 11/5642 |
| 2017/0125087 A1* | 5/2017 | Masuduzzaman ......................... |
| | | G11C 11/5628 |
| 2018/0301195 A1* | 10/2018 | Yip ................... G11C 16/10 |
| 2019/0139609 A1* | 5/2019 | Park ................ G11C 16/3459 |
| 2020/0126628 A1* | 4/2020 | Maejima ............ G11C 16/3454 |

OTHER PUBLICATIONS

Cho, et al., "A 512Gb 3-bit/Cell 7th-Generation 3D NAND Flash Memory with 184MB/s Write Throughput and 2.0Gb/s Interface," Samsung Electronics, South Korea, 2021 IEEE International Solid-State Circuits Conference.

Yang, et al., "Non-Volatile Memory With Fast Multi-Level Progam Verify," U.S. Appl. No. 17/329,304, filed May 25, 2021.

* cited by examiner

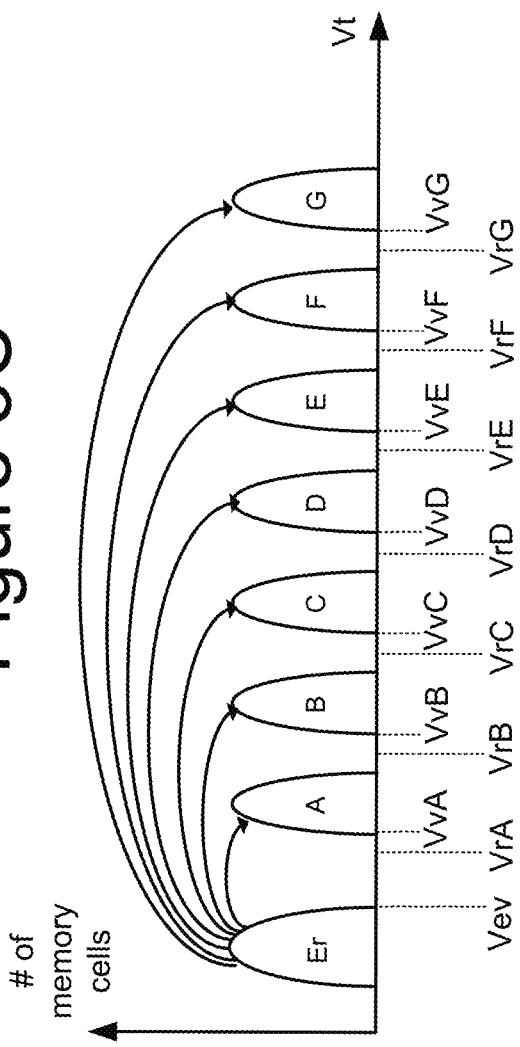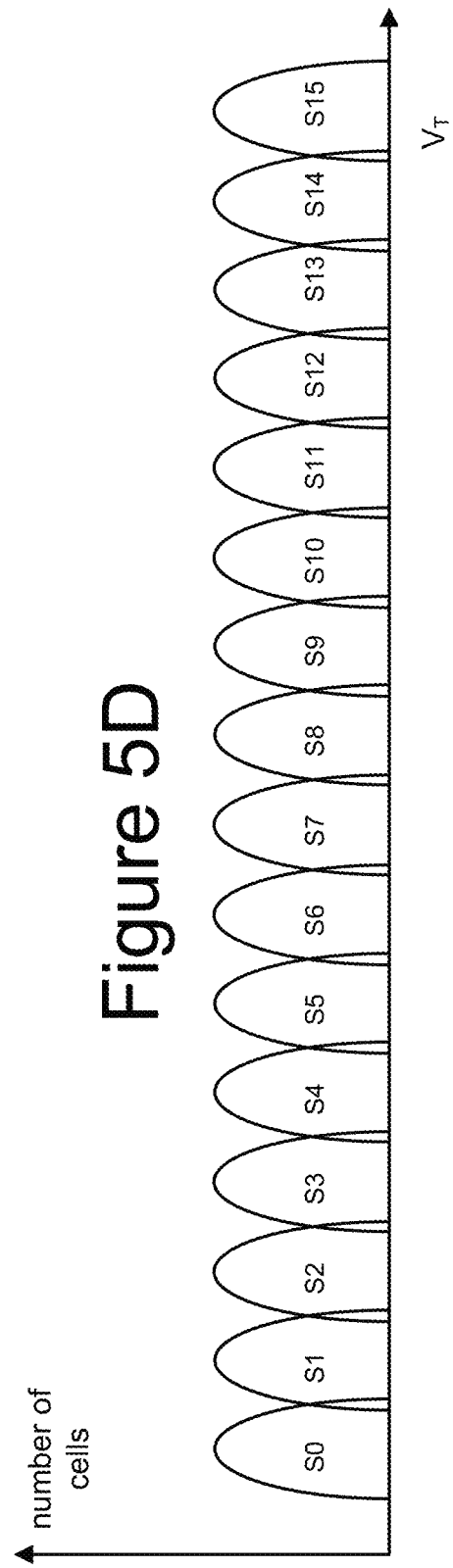

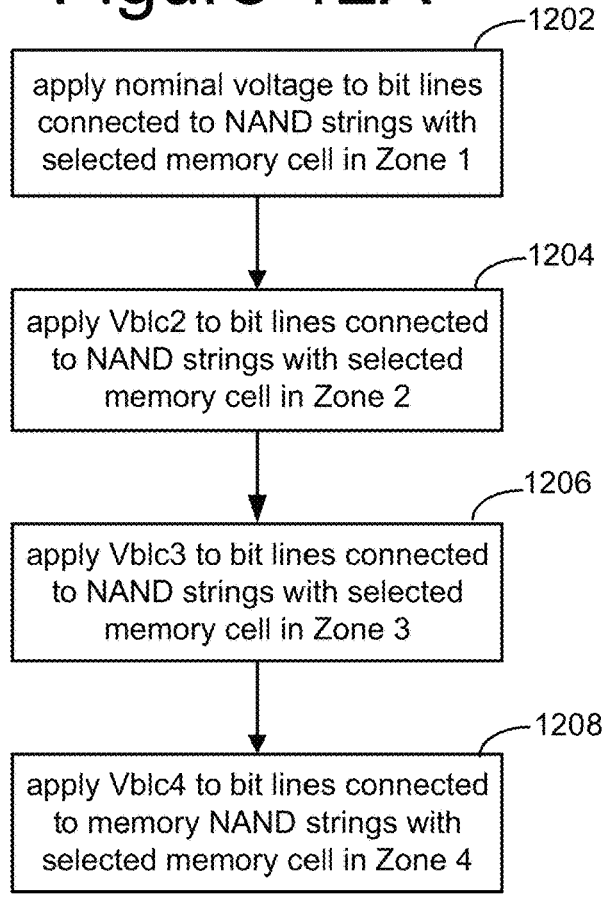
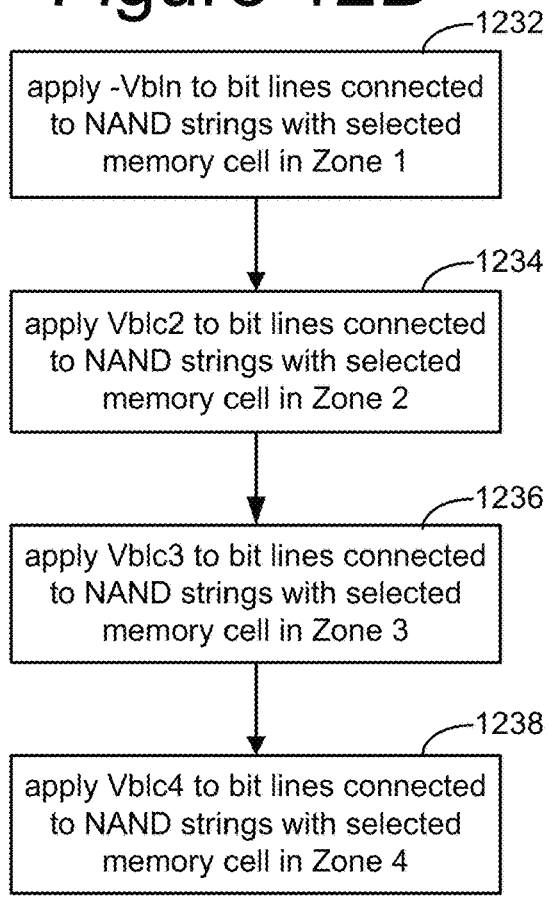
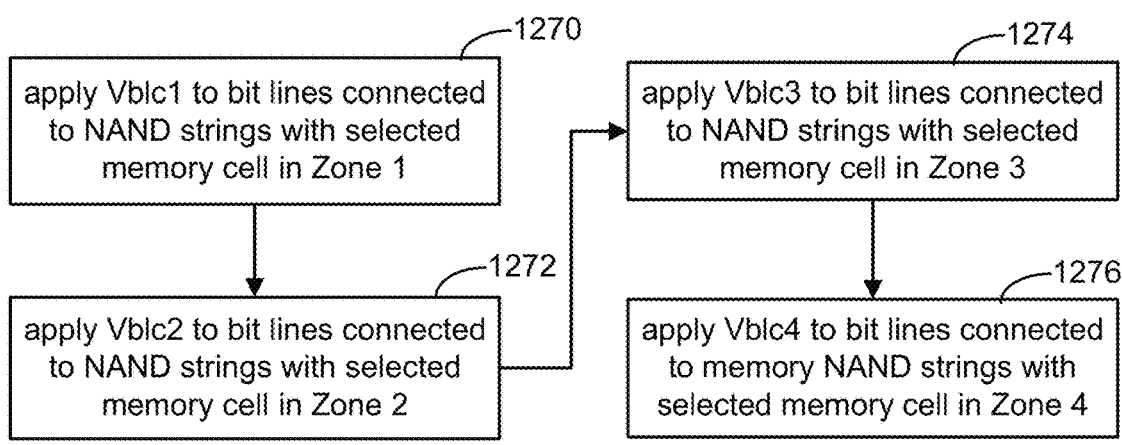

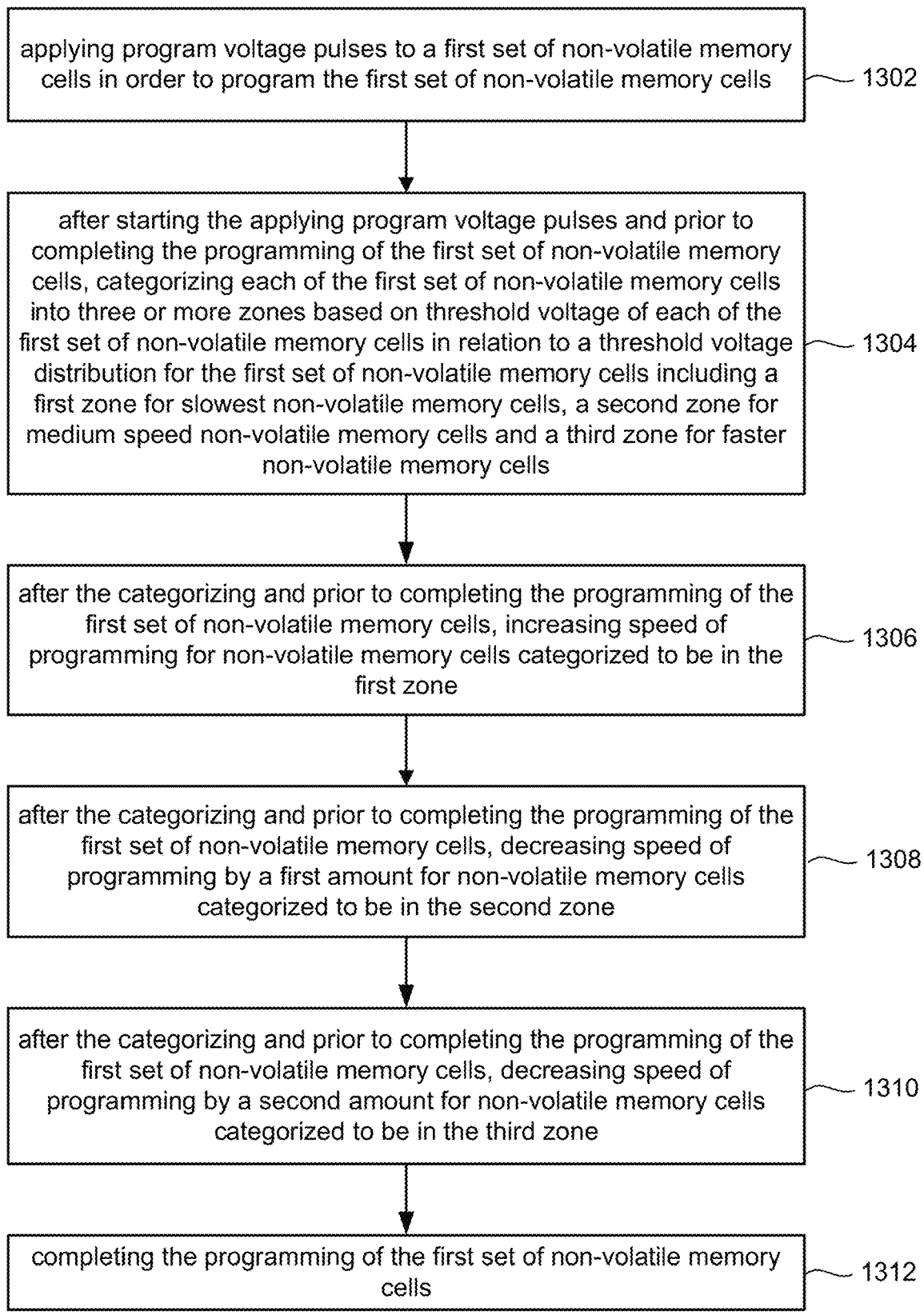

NON-VOLATILE MEMORY WITH ZONE BASED PROGRAM SPEED ADJUSTMENT

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (i.e., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

BRIEF DESCRIPTION OF THE DRAWINGS

Like-numbered elements refer to common components in the different figures.

FIG. 5C depicts threshold voltage distributions.
FIG. 5D depicts threshold voltage distributions.

FIGS. 12A-C are flow charts describing embodiments of a process for adjusting speed of program by adjusting bit line voltages.

FIG. 13 is a flow chart describing one embodiment of a process for programming that uses zone based program speed adjustments.

DETAILED DESCRIPTION

In one embodiment, non-volatile memory cells are programmed by applying a program signal to the memory cells in order to increase (or otherwise change) their threshold voltages so that the memory cells are in different threshold voltage distributions associated with different data states. In order to reduce the number of (or prevent) errors, it is desirable that the different threshold voltage distributions are narrow and separated from each other.

In order to decrease the width of threshold voltage distributions of programmed memory cells without unreasonably increasing the time needed to complete programming, a non-volatile memory uses a zone based program speed adjustment. The non-volatile memory starts programming a first set of the non-volatile memory cells until a minimum number of memory cells of the first set of non-volatile memory cells reach a first threshold voltage. In response to the minimum number of memory cells reaching the first threshold voltage, the first set of non-volatile memory cells are categorized into zones/groups based on threshold voltage. The speed of programming is then adjusted differently for each zone/group and programming is completed for the first set of non-volatile memory cells.

Figure 1:
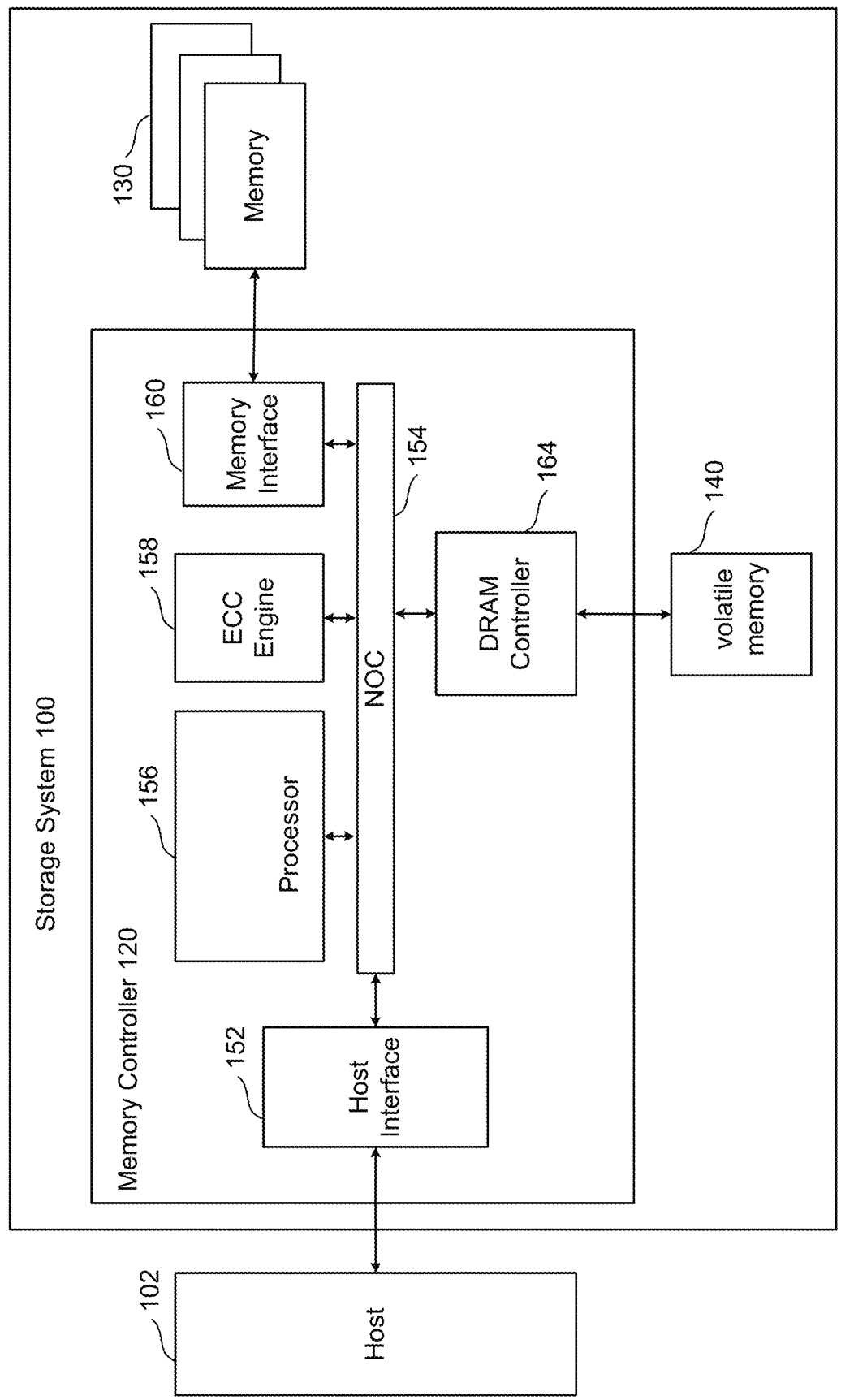
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
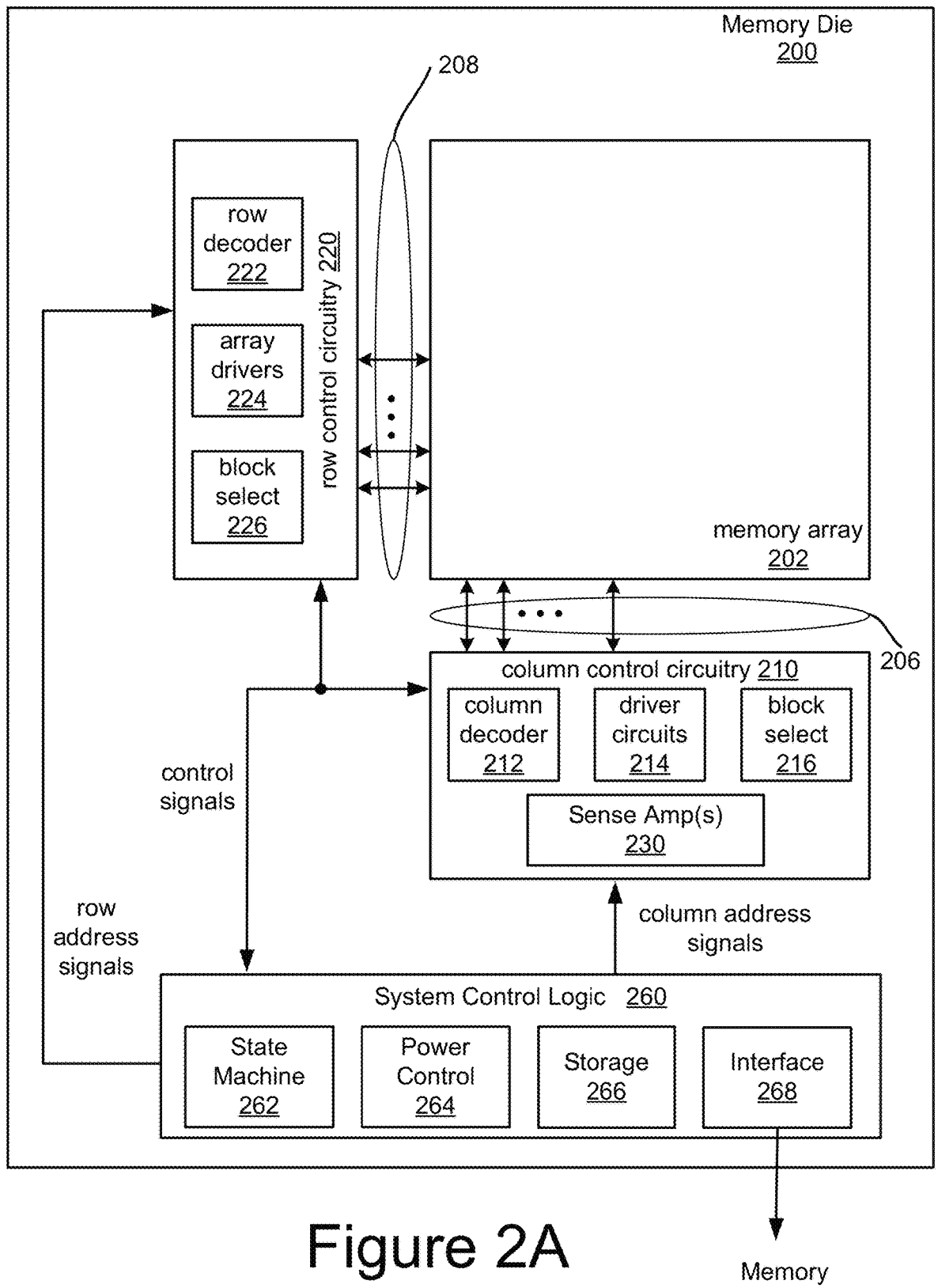
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366

(e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all the components depicted in FIG. 2A other than memory structure 202. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
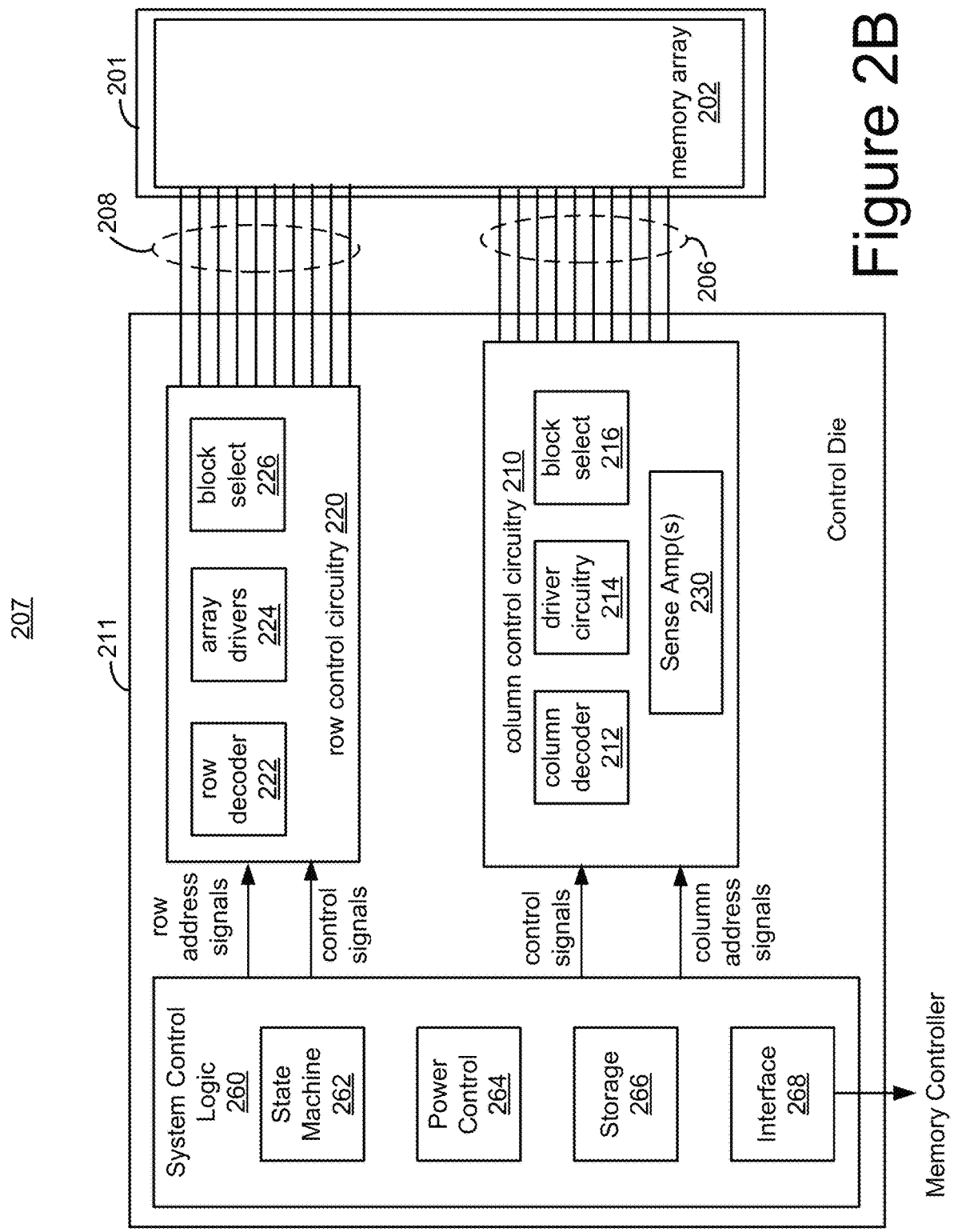
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
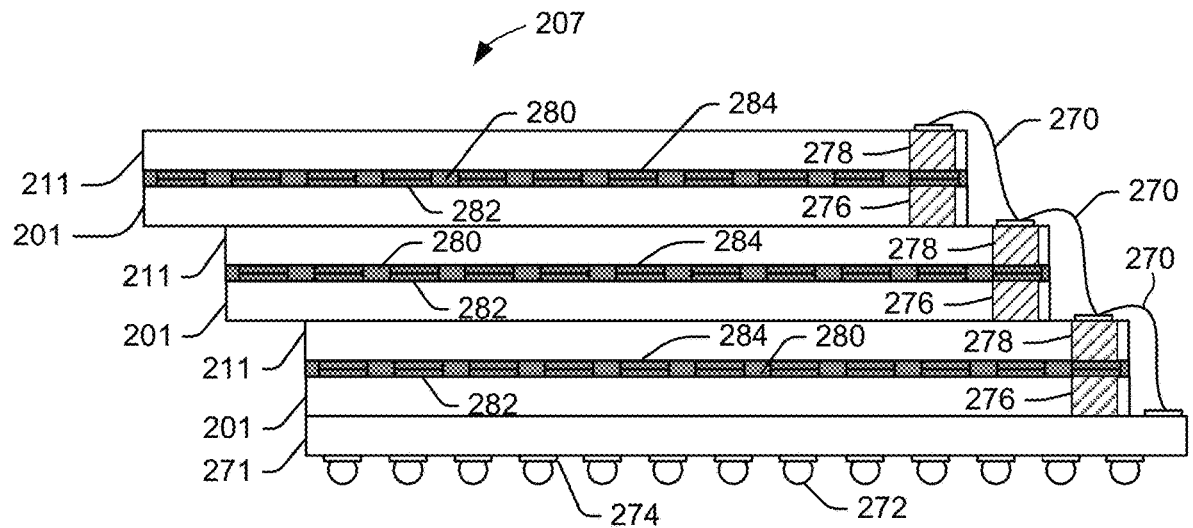
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
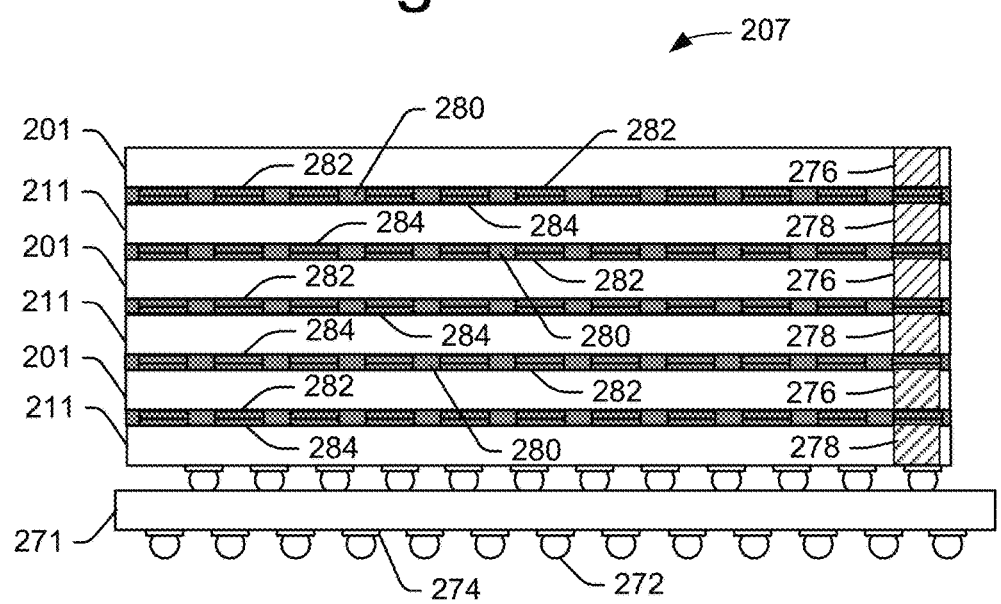

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
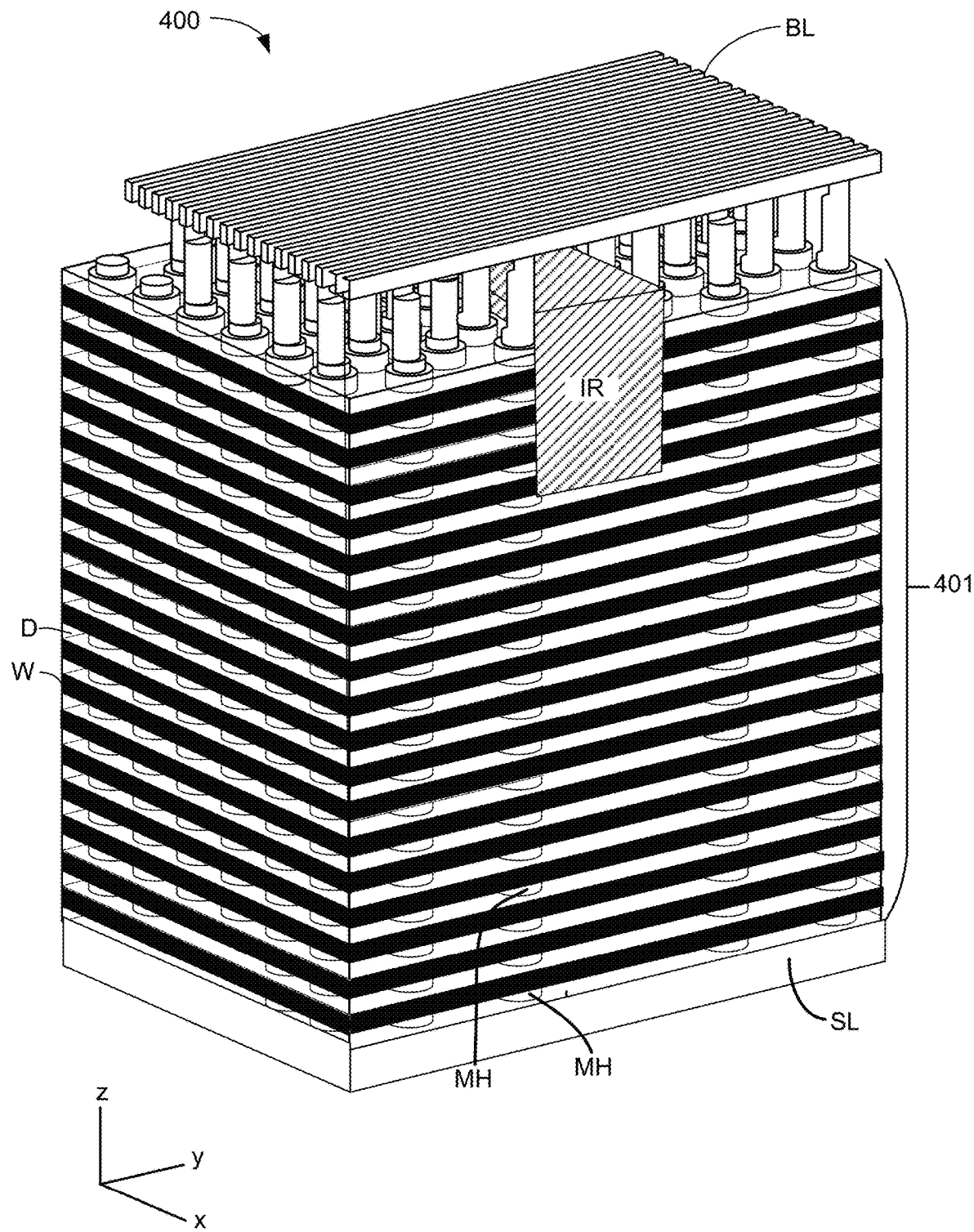
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
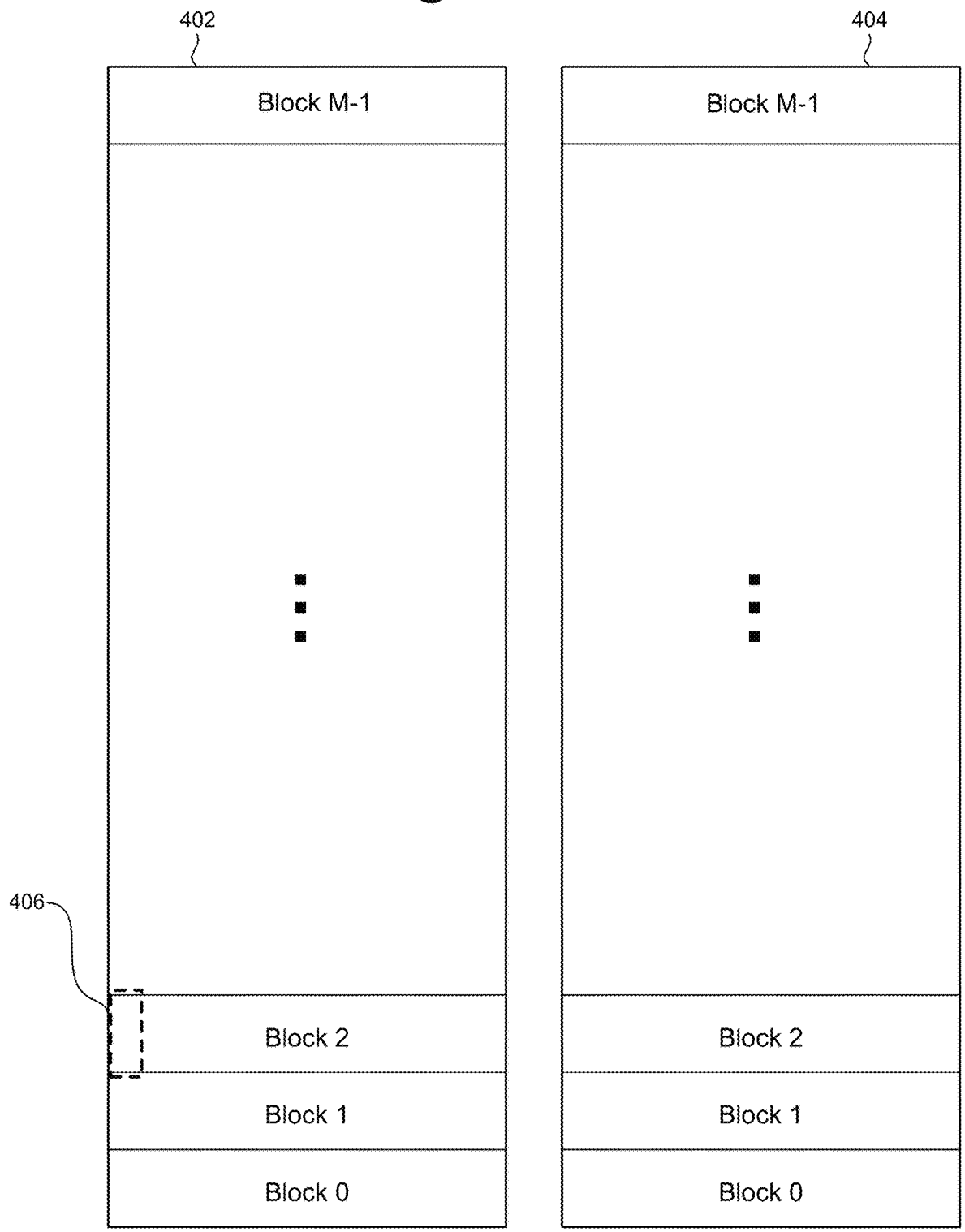
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all the vertical NAND strings for that block. Although FIG. 4A shows two planes 402/404, more or less than two planes can be implemented. In some embodiments, memory structure 202 includes eight planes.

Figure 4B:
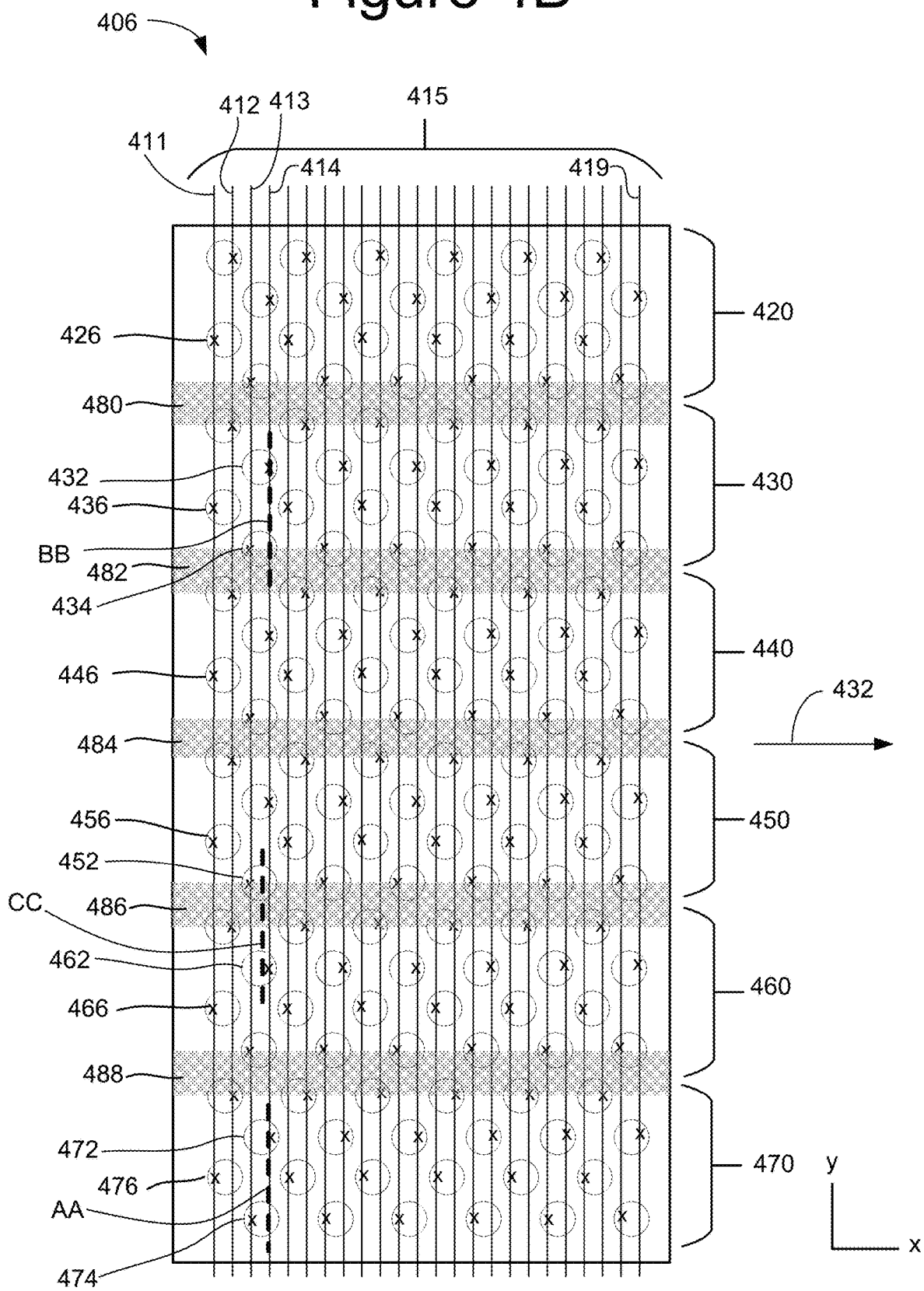
FIG. 4B depicts a top view of a portion of one embodiment of a block of memory cells.

FIGS. 4B-4J depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of $SiO_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line only connects to one vertical column/NAND string in each of regions (sub-blocks) 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
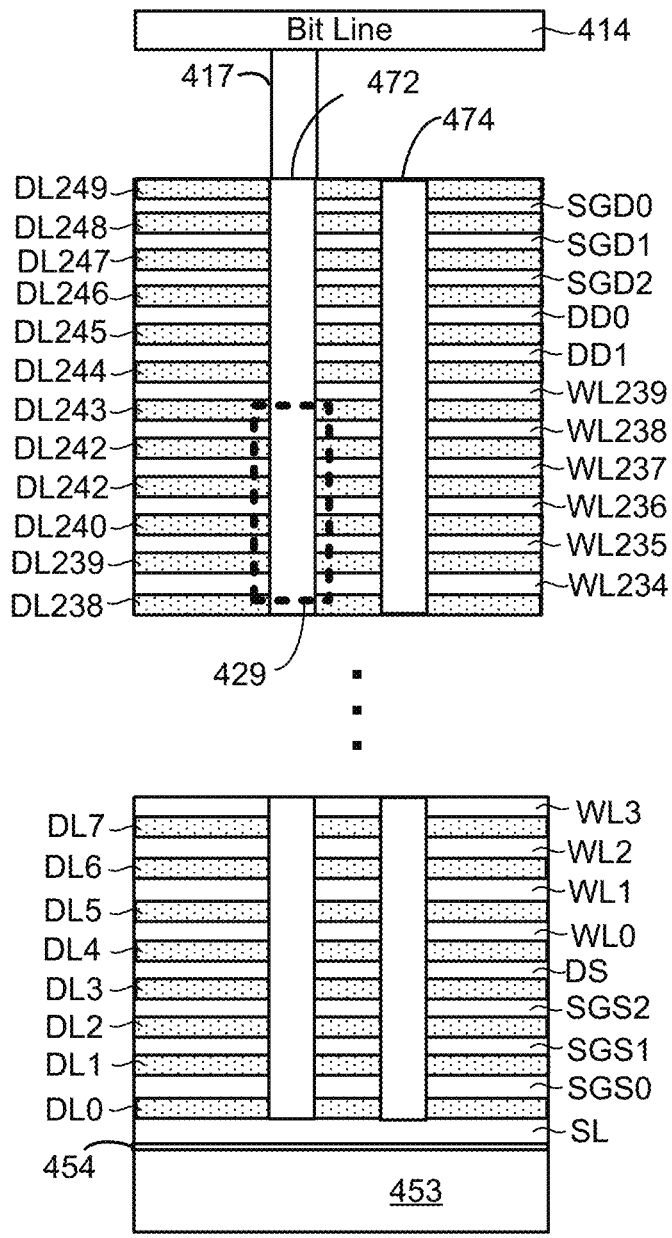
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4C includes three drain side select layers SGD0, SGD1 and SGD2; three source side select layers SGS0, SGS1, and SGS2; three dummy word line layers DD0, DD1, and DDS; two hundred and forty word line layers WL0-WL239 for connecting to data memory cells, and two hundred and fifty dielectric layers DL0-DL249. Other embodiments can implement more or less than the numbers described above for FIG. 4C. In one embodiment, SGD0, SGD1 and SGD2 are connected together; and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 442 has a source end at a bottom of the stack and a drain end at a top of the stack. As in agreement with FIG. 4B, FIG. 4C show vertical column 442 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL249. For example, dielectric layers DL240 is above word line layer WL235 and below word line layer WL236. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1 and DS connect to dummy memory cells. A dummy memory cell does not store and is not eligible to store host data (data provided from the host or entity outside of the storage system 100), such as data from a user of the host), while a data memory cell is eligible to store host data. Host data can be contrasted with system data that is generated by memory system 100 (e.g., L2P tables). In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

Note that the stack of word lines WL0-WL239 include two edge word lines at the edges of the stack, including top edge word line WL239 and bottom edge word line WL0. Word lines WL1-WL238 are non-edge word lines.

Figure 4D:
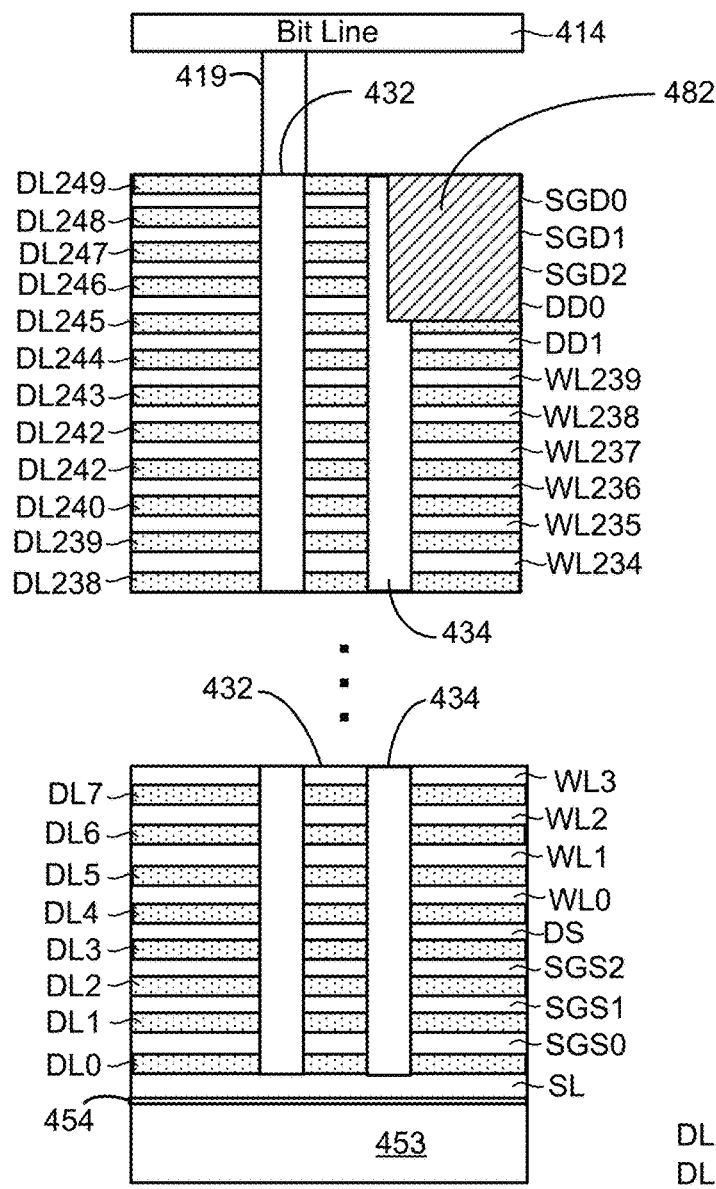
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 480, 482, 484, 486 and 488) occupy space that would have been used for a portion of the memory holes/vertical columns/NAND stings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, SGD2, and DD0 has a semi-circular cross section. In one embodiment, after the stack of alternating conductive and dielectric layers is formed, the stack is etched to create space for the isolation region and that space is then filled in with $SiO_2$.

Figure 4E:
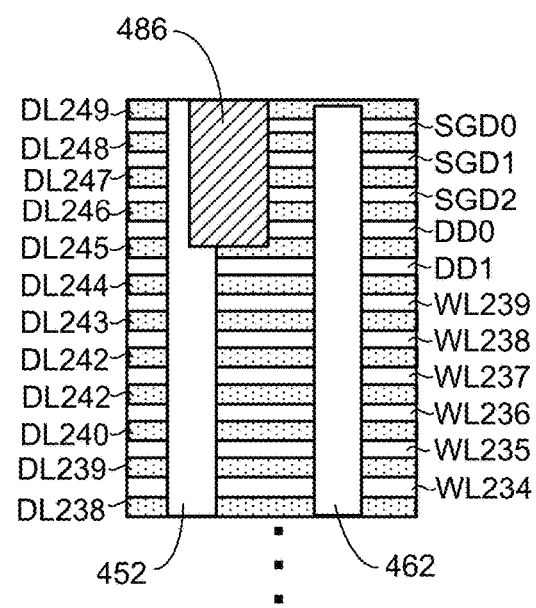
FIG. 4E depicts a cross sectional view of a portion of one embodiment of a block of memory cells.

FIG. 4E depicts a portion of one embodiment of a three dimensional memory structure 202 showing a cross-sectional view along line CC of FIG. 4B. This cross sectional view cuts through vertical columns (NAND strings) 452 and 4624 (see FIG. 4B). FIG. 4E shows the same alternating conductive and dielectric layers as FIG. 4C. FIG. 4E also shows isolation region 486 cutting into vertical columns (NAND string) 452.

Figure 4F:
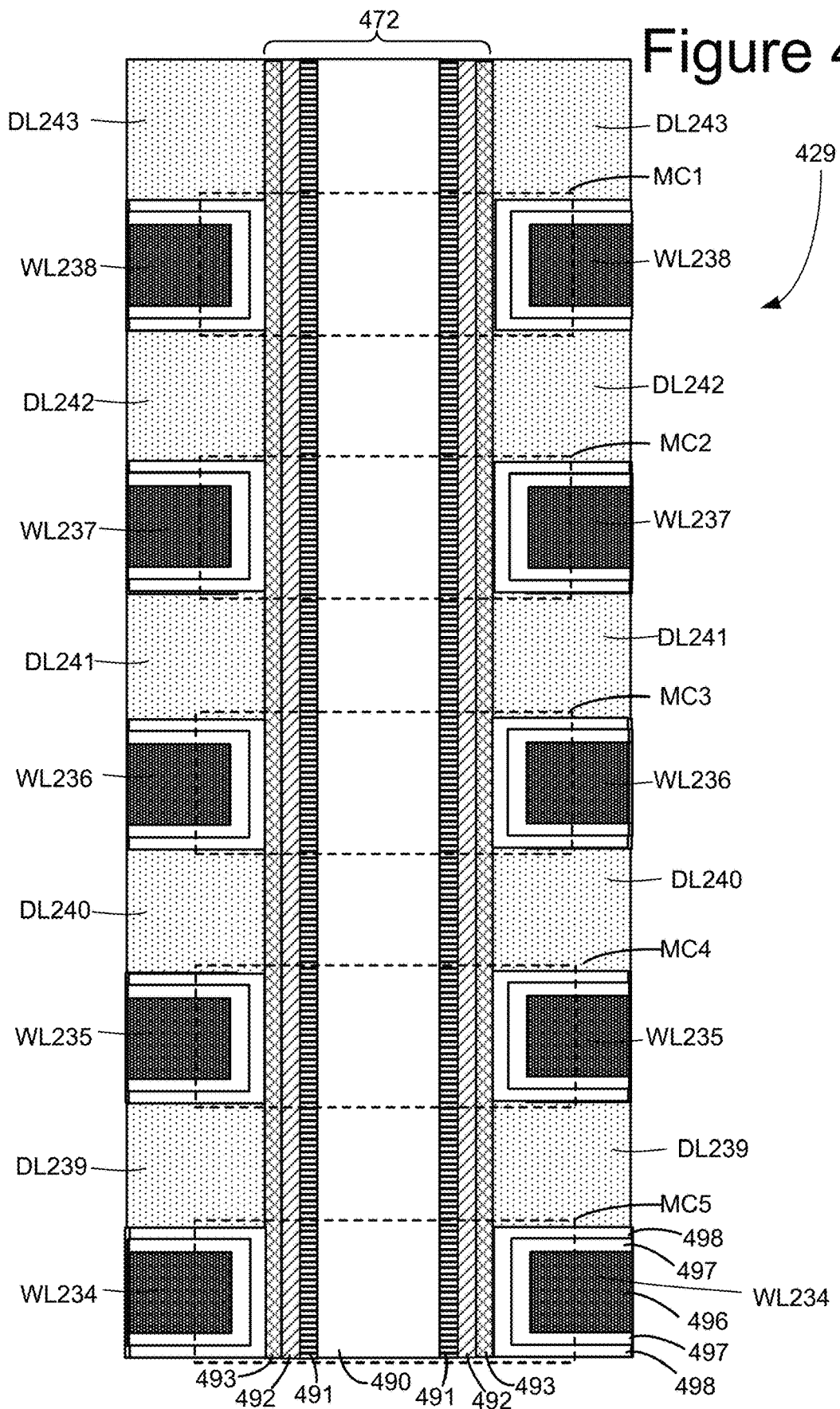
FIG. 4F is a cross sectional view of one embodiment of a vertical column of memory cells.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4F depicts dielectric layers DLL239, DLL240, DLL241, DLL242 and DLL243, as well as word line layers WLL234, WLL235, WLL236, WLL237, and WLL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WLL238 and a portion of vertical column 472 comprise a memory cell MC1. Word line layer WL237 and a portion of vertical column 472 comprise a memory cell MC2. Word line layer WLL236 and a portion of vertical column 472 comprise a memory cell MC3. Word line layer WLL235 and a portion of vertical column 472 comprise a memory cell MC4. Word line layer WLL234 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
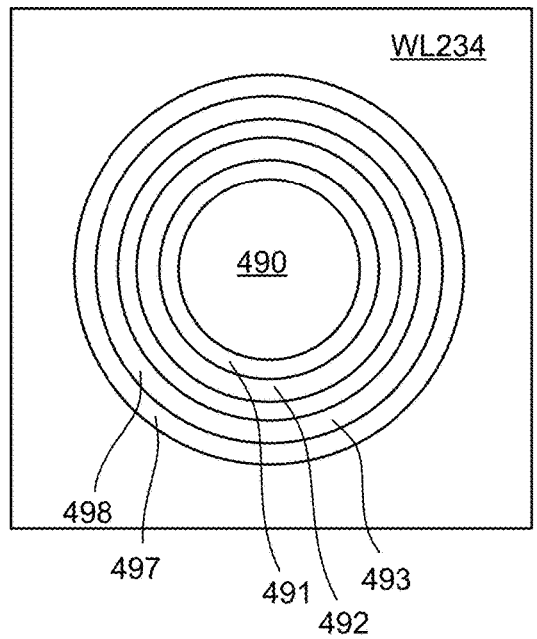
FIG. 4G depicts a cross section of as memory hole that implements a vertical NAND string.

FIG. 4G shows a cross section of vertical column 472 of FIG. 4F, cut through MC5. Thus, FIG. 4G depicts word line layer WL234, inner core 490, channel 491, tunneling dielectric 492, charge trapping layer 493, aluminum oxide layer 497, and blocking oxide layer 498.

Figure 4H:
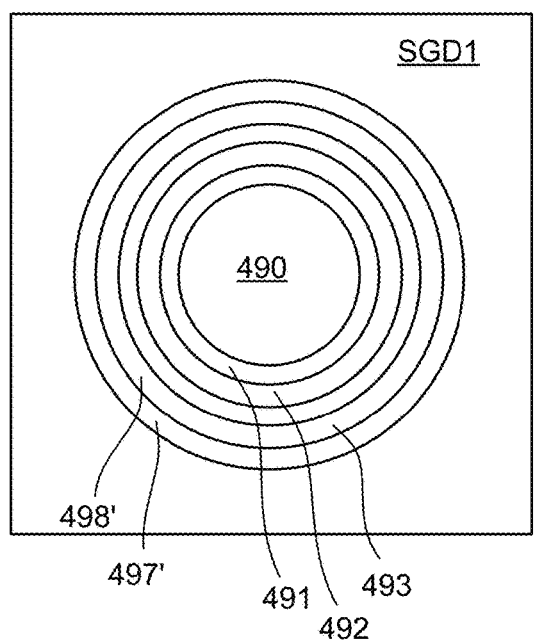
FIG. 4H depicts a cross section of as memory hole that implements a vertical NAND string.

FIG. 4H shows a cross section of vertical column 472 of FIG. 4F, cut through SGD1 (a select gate layer implementing a select gate). Thus, FIG. 4H depicts drain side select line layer SGD1, inner core 490, channel 491, tunneling dielectric 492, charge trapping layer 493, aluminum oxide layer 497, and blocking oxide layer 498.

Figure 4I:
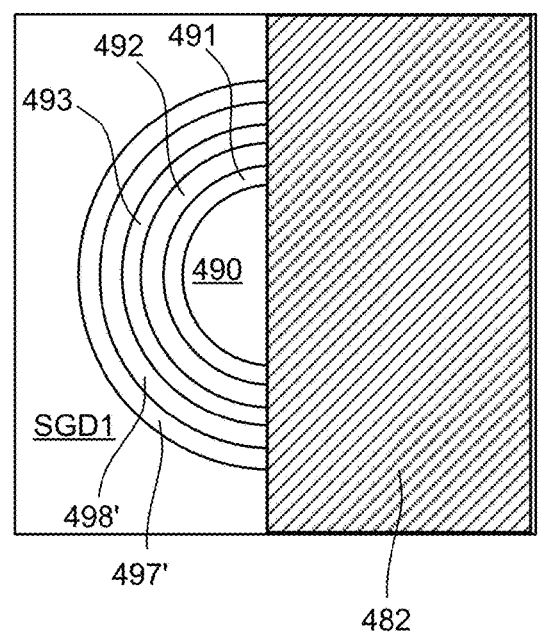
FIG. 4I depicts a cross section of as memory hole that implements a vertical NAND string.

FIG. 4I shows a cross section of vertical column 434 of FIG. 4D, cut through SGD1. Thus, FIG. 4I depicts drain side select line layer SGD1, inner core 490, channel 491, tunneling dielectric 492, charge trapping layer 493, aluminum oxide layer 497, and blocking oxide layer 498. FIG. 4I also shows a portion of isolation region 482. As can be seen in FIG. 4I, the select gate (select gate layer and select line layer) of vertical column 434 is semicircular in shape (or partially circular in shape) due to vertical column (NAND string) 434 intersecting isolation region 482.

Figure 4J:
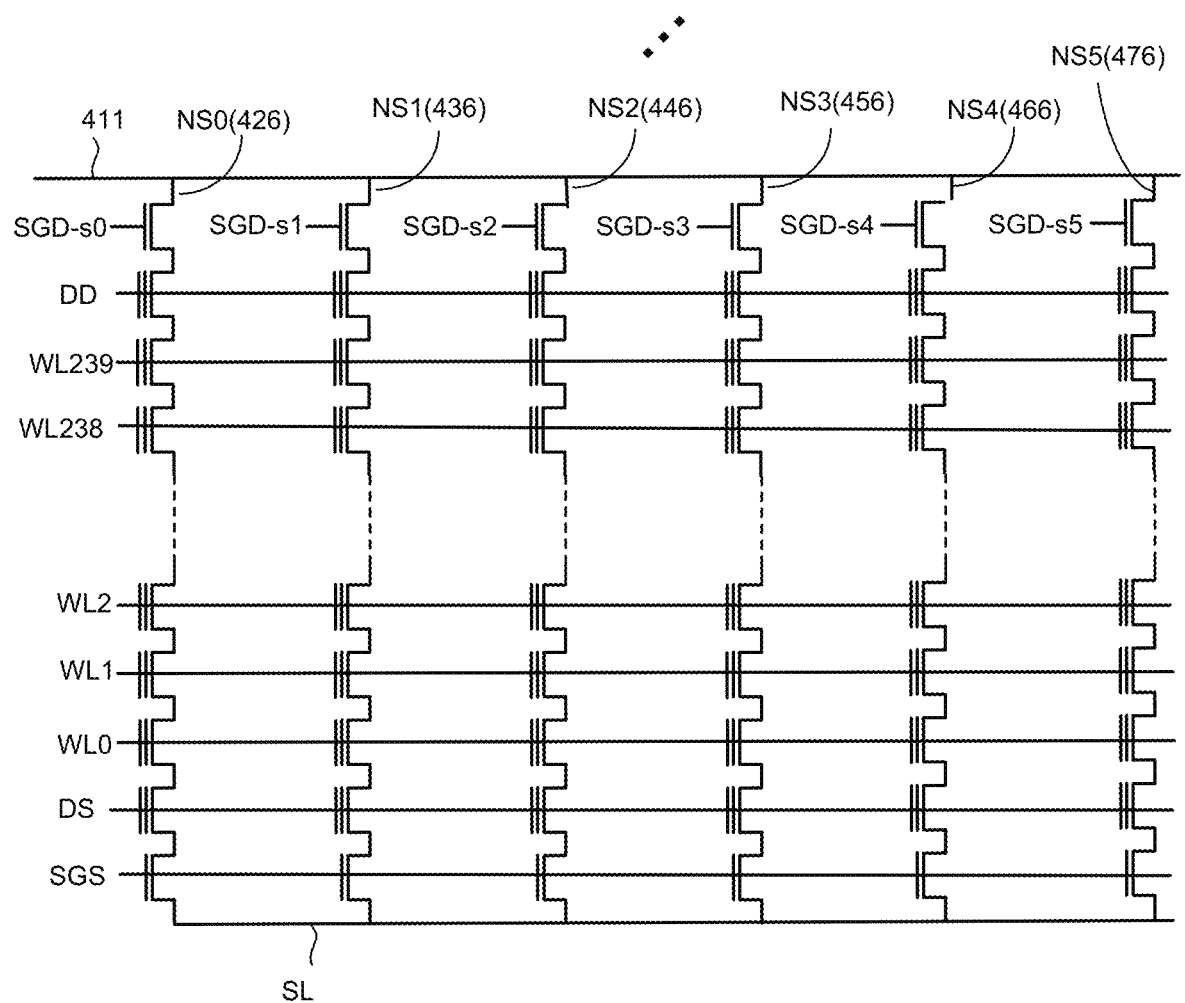
FIG. 4J is a schematic of a plurality of NAND strings in multiple sub-blocks of a same block.

FIG. 4J is a schematic diagram of a portion of the memory array 202 depicted in in FIGS. 4-4I. FIG. 4J shows physical data word lines WL0-WL239 running across the entire block. The structure of FIG. 4J corresponds to a portion 306 in Block 2 of Figure A, including bit line 411. Within the block, in one embodiment, each bit line is connected to six NAND strings. Thus, FIG. 4J shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4E as SGS. Although the select gates SGD-s0, SGD-s1, SGD-s2, SGD-s 3, SGD-s4, and SGD-s5 are isolated from each other due to the isolation regions, the data word lines WL0-WL239 of each sub-block are connected together.

The isolation regions (480, 482, 484, 486 and 486) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4J only shows the NAND strings connected to bit line 411. However, a full schematic of the block would show every bit line and six vertical NAND strings connected to each bit line.

Although the example memories of FIGS. 4-4J are three dimensional memory structure that includes vertical NAND strings with charge-trapping material, other (2D and 3D) memory structures can also be used with the technology described herein.

Figure 5A:
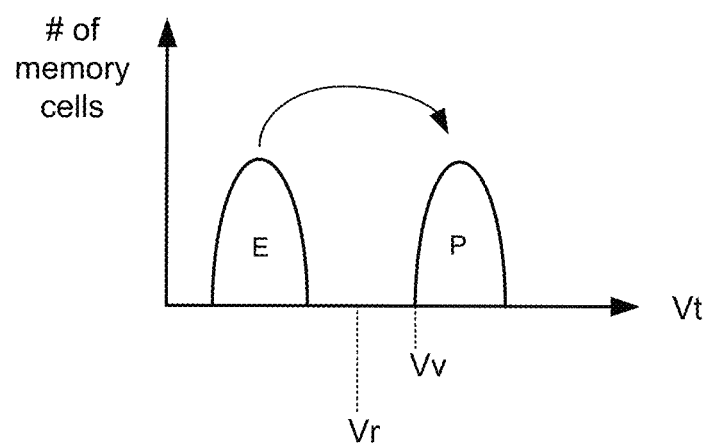
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read compare voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

FIGS. 5B-F illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

Figure 5B:
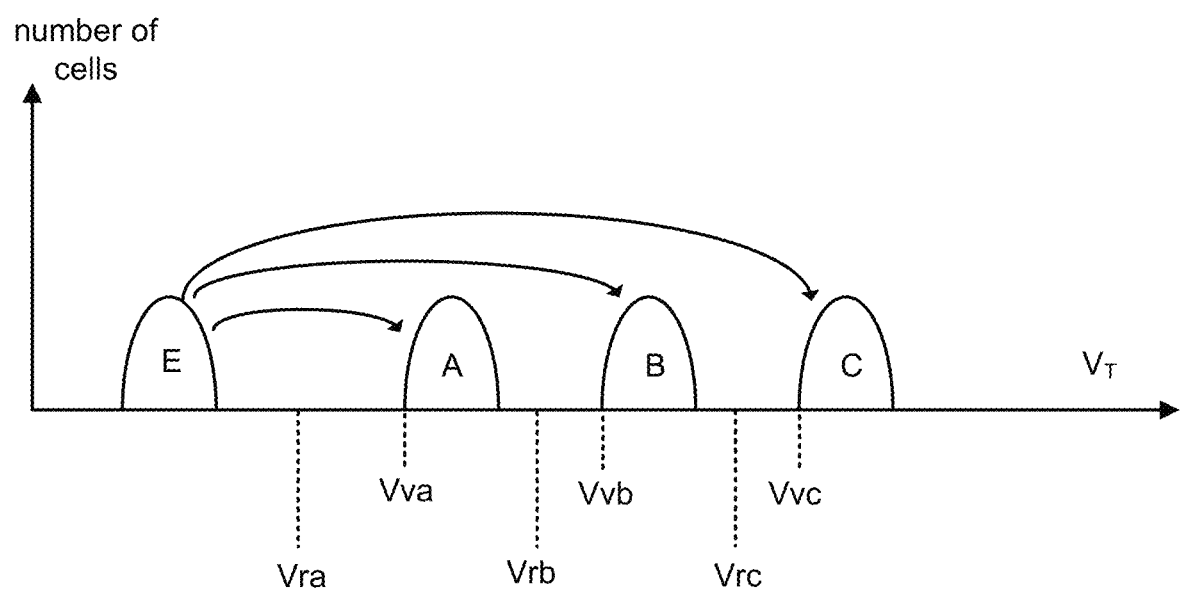
FIG. 5B depicts threshold voltage distributions.

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read compare voltages, VrA, VrB, VrC, VrD, VrE, VrF, and VrG for reading data from memory cells. By testing (e.g., performing sense operations) whether the threshold voltage of a given memory cell is above or below the seven read compare voltages, the system can determine what data state (i.e., A, B, C, D, . . . ) a memory cell is in.

FIG. 5C also shows seven verify compare voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages VrA, VrB, VrC, VrD, VrE, VrF, and VrG, of FIG. 5C) or verify operation (e.g. see verify target voltages VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 5E:
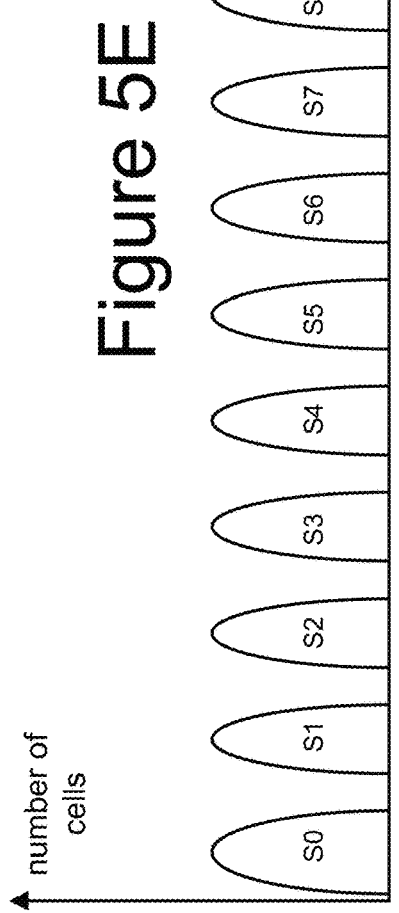
FIG. 5E depicts threshold voltage distributions.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read compare voltages can help to mitigate such effects. Using ECC during the read process can fix errors and ambiguities. Note that in some embodiments, the threshold voltage distributions for a population of memory cells storing four bits of data per memory cell do not overlap and are separated from each other; for example, as depicted in FIG. 5E. The threshold voltage distributions of FIG. 5D will include read compare voltages and verify compare voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 0  | 1  | 1  | 1   | 1   | 1   | 1   | 0   | 0   |

TABLE 3-continued

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

Figure 5F:
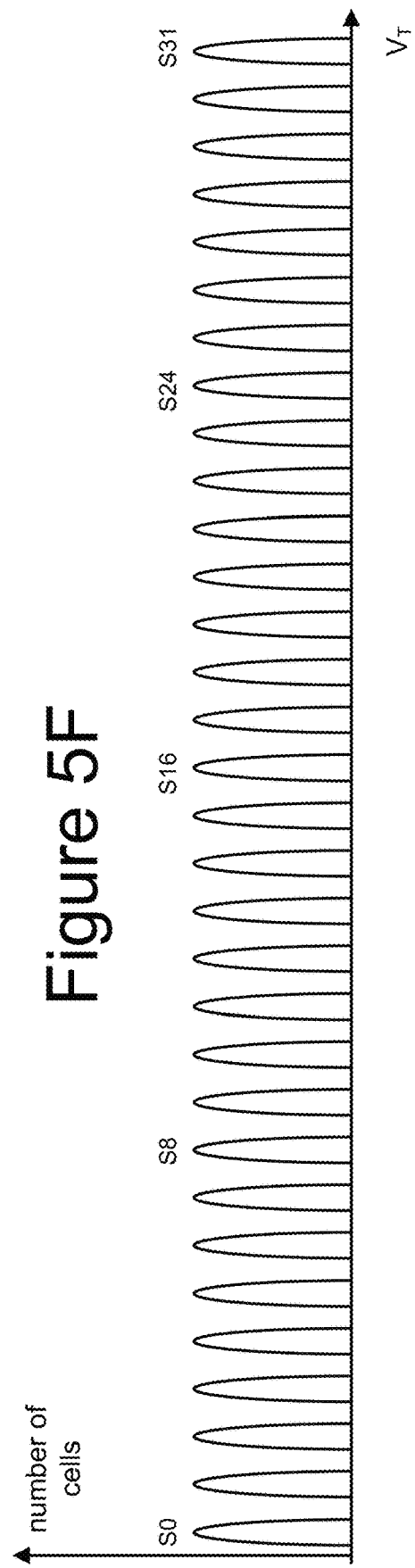
FIG. 5F depicts threshold voltage distributions.

FIG. 5F depicts threshold voltage distributions when each memory cell stores five bits of data, which is another example of MLC data. In one example implementation, when memory cells store five bits of data, the data is stored in any of thirty two data state (e.g., S0-S31).

Figure 6:
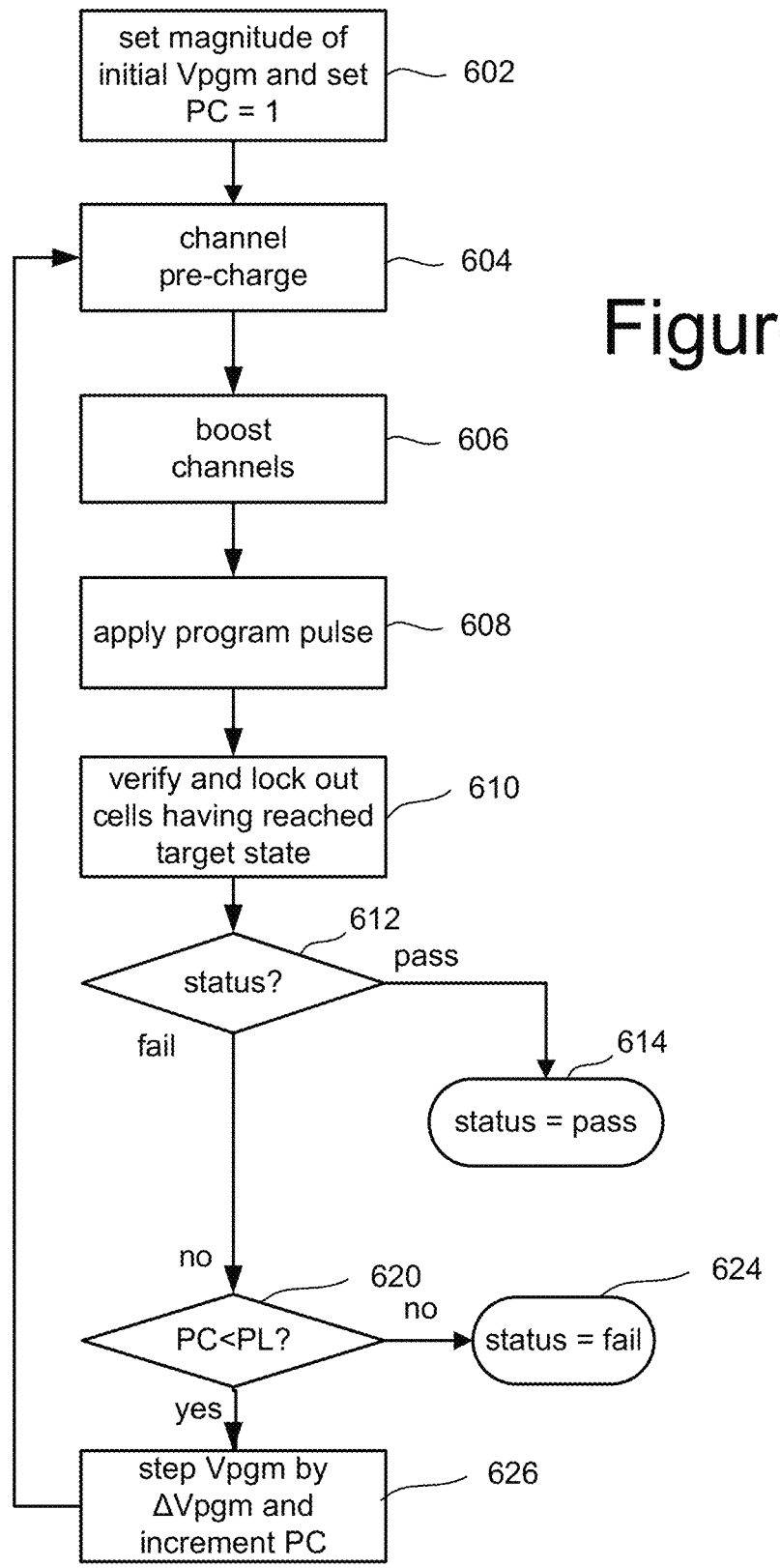
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops or iterations, each of which includes a program phase and a verify phase. The process of FIG. 6 is performed to implement the full sequence programming, as well as other programming schemes including multi-pass programming. When implementing multi-pass programming, the process of FIG. 6 is used to implement any/each pass of the multi-pass programming process.

Typically, the programming voltage signal applied to the control gates (via a selected data word line) during a program operation is applied as a series of program voltage pulses. Between programming voltage pulses are a set of verify voltage pulses to perform verification. In many implementations, the voltage magnitude of the program voltage pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts), also referred to as pass voltages, to perform boosting schemes. A program inhibit voltage is applied to the bit lines coupled the unselected NAND strings. In one embodiment, for example, the channel is pre-charged to ~2 volts in step 604 and then floated. In step 606, the channel is boosted up from the 2 volts to a boosting voltage of approximately 8-10 volts.

In step 608, a program voltage pulse of the programming voltage signal Vpgm is applied to the selected word line (the word line selected for programming). If a memory cell on a NAND string should be programmed, then the corresponding bit line connected to the select NAND string is biased at a program enable voltage (e.g., 0 volts). If a memory cell on a NAND string should be inhibited from programmed, then the corresponding bit line connected to the unselected NAND string is biased at an inhibit voltage (e.g., VDD or 3.5 volts). In step 608, the program voltage pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify compare levels. In one embodiment, the verification process is performed by testing whether the threshold voltages of the memory cells selected for programming have reached the appropriate verify compare voltage (e.g., VvA, VvB, VvC, VvD, VvE, VvF, and VvG of FIG. 5C). In step 610, a memory cell may be locked out after the memory cell has been verified (by a test of the threshold voltage) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise, if in step 612, it is determined that not all of the memory cells have reached their target threshold voltages (fail), then the programming process continues at step 620. In one embodiment, the system may determine that the programming process is complete and successful because enough memory cells were programmed and verified to their target states; for example, if the number of memory cells not verified successfully is smaller (or much smaller) than the capacity of the error correction scheme to fix errors during the read process then the programming process is considered complete and successful.

In step 620, the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the program counter PC is incremented by 1 and the programming voltage signal Vpgm is stepped up to the next magnitude. For example, the next program voltage pulse will have a magnitude greater than the previous pulse by a step size ΔVpgm (e.g., a step size of 0.1-1.0 volts). After step 626, the process loops back to step 604 and another loop/iteration (steps 604-626) of the programming process of FIG. 6 is performed, including applying another program voltage pulse to the selected word line (by the control die).

In some embodiments, memory cells are programmed in an order from the source side to the drain side. For example, first the process of FIG. 6 is performed to program memory cells connected to WL0, followed by using the process of FIG. 6 to program memory cells connected to WL1, followed by using the process of FIG. 6 to program memory cells connected to WL2, followed by using the process of FIG. 6 to program memory cells connected to WL3, . . . followed by using the process of FIG. 6 to program memory cells connected to WL239.

In another embodiment, memory cells are programmed in an order from the drain side to the source side. For example, first the process of FIG. 6 is performed to program memory cells connected to WL239, followed by using the process of FIG. 6 to program memory cells connected to WL238, followed by using the process of FIG. 6 to program memory cells connected to WL237, followed by using the process of FIG. 6 to program memory cells connected to WL236, . . . followed by using the process of FIG. 6 to program memory cells connected to WL1, followed by using the process of FIG. 6 to program memory cells connected to WL0.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 7:
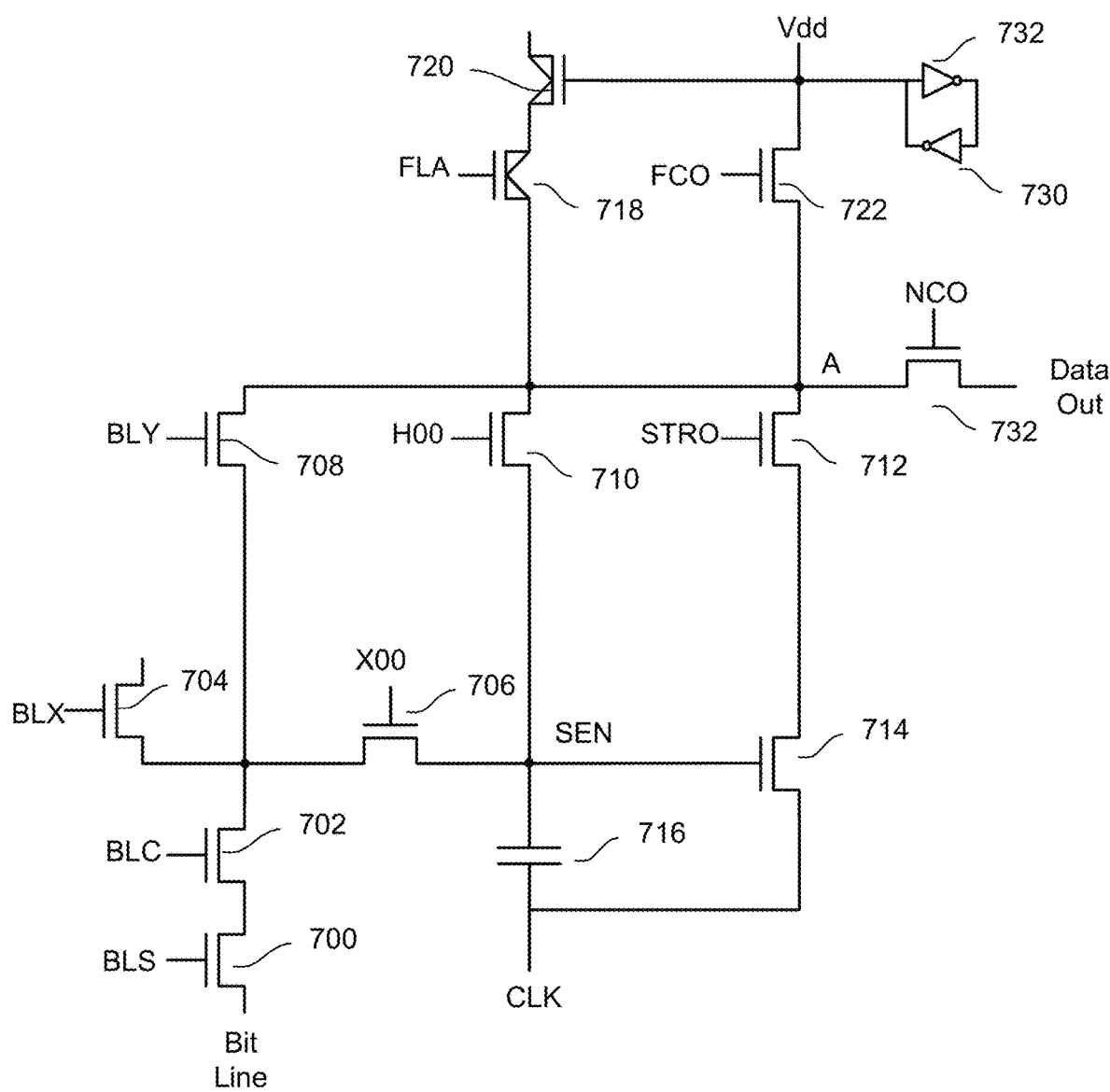
FIG. 7 is a schematic diagram of one embodiment of a sense amplifier.

The processes of reading data includes sensing to determine if a memory cell has a threshold voltage that exceeds a read compare voltage (e.g., VrA, VrB, VrC, VrD, VrE, VrF, and VrG of FIG. 5C) applied to the selected word line. The processes of verifying programming includes sensing to determine if a memory cell has a threshold voltage that exceeds a verify compare voltage (e.g., VvA, VvB, VvC, VvD, VvE, VvF, and VvG of FIG. 5C) applied to the selected word line. In one embodiment, the sensing is performed by sense amplifiers 230 of column control circuitry 210 (see FIGS. 2A and 2B). In embodiments with integrated memory assemblies 207, the sensing is performed by sense amplifiers 230 of column control circuitry 210 on a control die 211. FIG. 7 is a schematic diagram depicting one example circuit of a sense amplifier (of sense amplifiers 230 of column control circuitry 210) that can perform the sensing during a read or verify processes. Other sense amplifier circuits can also be used. As described above and below, the circuit of FIG. 7 will pre-charge a capacitor (or other charge storage device) to a pre-charge magnitude, discharge the capacitor through the memory cell for a sense time, and sense voltage at the capacitor after the sense time. The sensed voltage will be indicative of whether the memory cells conducted the current being sensed for, which is indicative of whether the threshold voltage of the memory cell is greater than or less than the read compare voltage or verify compare voltage being tested for (corresponding to the control gate voltage).

FIG. 7 shows transistor 700 connected to the Bit Line and transistor 702. Transistor 700 receives the signal BLS at its gate, and is used to connect to or isolate the Bit Line (sometimes called an isolation transistor). Transistor 702 receives the signal BLC at its gate, and is used as a voltage clamp (e.g., voltage clamp transistor). The gate voltage BLC is biased at a constant voltage equal to the desired Bit Line voltage plus the threshold voltage of transistor 702. The function of transistor 702, therefore, is to maintain a constant Bit Line voltage during a sensing operation (e.g., during read or verify), even if the current through the Bit Line changes.

Transistor 702 is connected to transistors 704, 706 and 708. Transistor 706 is connected to capacitor 716 at the node marked SEN. The purpose of transistor 706 is to connect capacitor 716 to the Bit Line and disconnect capacitor 716 from the Bit Line so that capacitor 716 is in selective communication with the Bit Line. In other words, transistor 706 regulates the sense time mentioned above. That is, while transistor 706 is turned on capacitor 716 can discharge through the Bit Line, and when transistor 706 is turned off capacitor 716 cannot discharge through the Bit Line. The gate voltage of transistor 706 is labeled as X00. As described herein, in some embodiments of the disclosed technology, the sense time is subject to adjustment as described below. Changing the sense time can include changing the timing of the signal X00.

The node at which transistor 706 connects to capacitor 716 is also connected to transistor 710 and transistor 714. Transistor 710 is connected to transistors 708, 712 and 718. Transistor 718 is also connected to transistor 720. Transistors 718 and 720 are PMOS transistors while the other transistors of FIG. 7 are NMOS transistors. Transistors 710, 718, and 720 provide a pre-charging path to capacitor 716. A voltage (e.g., Vdd or other voltage) is applied to the source of transistor 720. By appropriately biasing transistors 710, 718 and 720, the voltage applied to the source of transistor 720 can be used to pre-charge capacitor 716. After pre-charging, capacitor 716 can discharge through the Bit Line via transistor 706 (assuming that transistors 700 and 702 are conducting).

The circuit of FIG. 7 includes inverters 730 and 732 forming a latch circuit. The output of inverter 732 is connected to the input of inverter 730 and the output of inverter 730 is connected to the input of inverter 732 as well as transistors 720 and 722. The input of inverter 732 will receive Vdd and the two inverters 730, 732 will act as a latch to store Vdd. The input of inverter 732 can also be connected to another value. Transistors 712 and 722 provide a path for communicating the data stored by inverters 730 and 732 to transistor 714. Transistor 722 receives the signal FCO at its gate. Transistor 712 receives the signal STRO at its gate. By raising or lowering FCO and STRO, a path is provided or cut off between the inverters 730, 732 and transistor (sensing switch) 714. The gate of transistor 714 is connected capacitor 716, transistor 706 and transistor 710 at the node marked SEN. The other end of capacitor 716 is connected to the signal CLK.

As discussed above, capacitor 716 is pre-charged via transistors 710, 718 and 720. This will raise the voltage at the SEN node to a pre-charge voltage level (Vpre). When transistor 706 turns on, capacitor 716 can discharge its charge through the Bit Line and the selected memory cell if the threshold voltage of the memory cell is below the voltage level being tested for. If the capacitor 716 is able to discharge, then the voltage at the capacitor (at the SEN node) will decrease.

The pre-charge voltage (Vpre) at the SEN node is greater than the threshold voltage of transistor 714; therefore, prior to the sense time, transistor 714 is on (conducting). Since transistor 714 is on during the sense time, then transistor 712 should be off. If the capacitor does not sufficiently discharge during the sense time, then the voltage at the SEN node will remain above the threshold voltage of transistor 714 and the charge at the inverters 730, 732 can be discharged into the CLK signal when STRO turns on transistor 712. If the capacitor discharges sufficiently during the strobe time, then the voltage at the SEN node will decrease below the threshold voltage of transistor 714; thereby, turning off transistor 714 and the data (e.g., Vdd) stored at inverters 730, 732 is prevented from being discharged through CLK. So testing whether the diodes 730, 732 maintain their charge or discharge will indicate the result of the verification process. In one embodiment, the result can be read at node A via transistor 732 (Data Out) by turning on transistor 734 gate signal NCO. In some embodiments, the result can be read at node A multiple times during the sense time in order to test for multiple read compare voltages or multiple verify compare voltages.

The pre-charge level of capacitor 716 (and, thus, the pre-charge voltage at node SEN) is limited by the current passing through transistor 710. The current that passes through transistor 710 is limited by the gate voltage H00. As such, the pre-charge voltage at node SEN is limited by the voltage H00 less the threshold voltage of transistor 710. With this arrangement, the system can regulate the pre-charge voltage at node SEN by regulating H00. A larger voltage at H00 results in a larger voltage at the SEN node when pre-charging. A lower voltage at H00 results in a lower voltage at the SEN node when pre-charging.

When the system performs a read/verify operation, the voltage applied to the control gate of the memory cell may cause the channel (connected to the bit line) of the cell to conduct. If this happens, a capacitor is discharged through the channel, lowering in voltage as it discharges.

Figure 8:
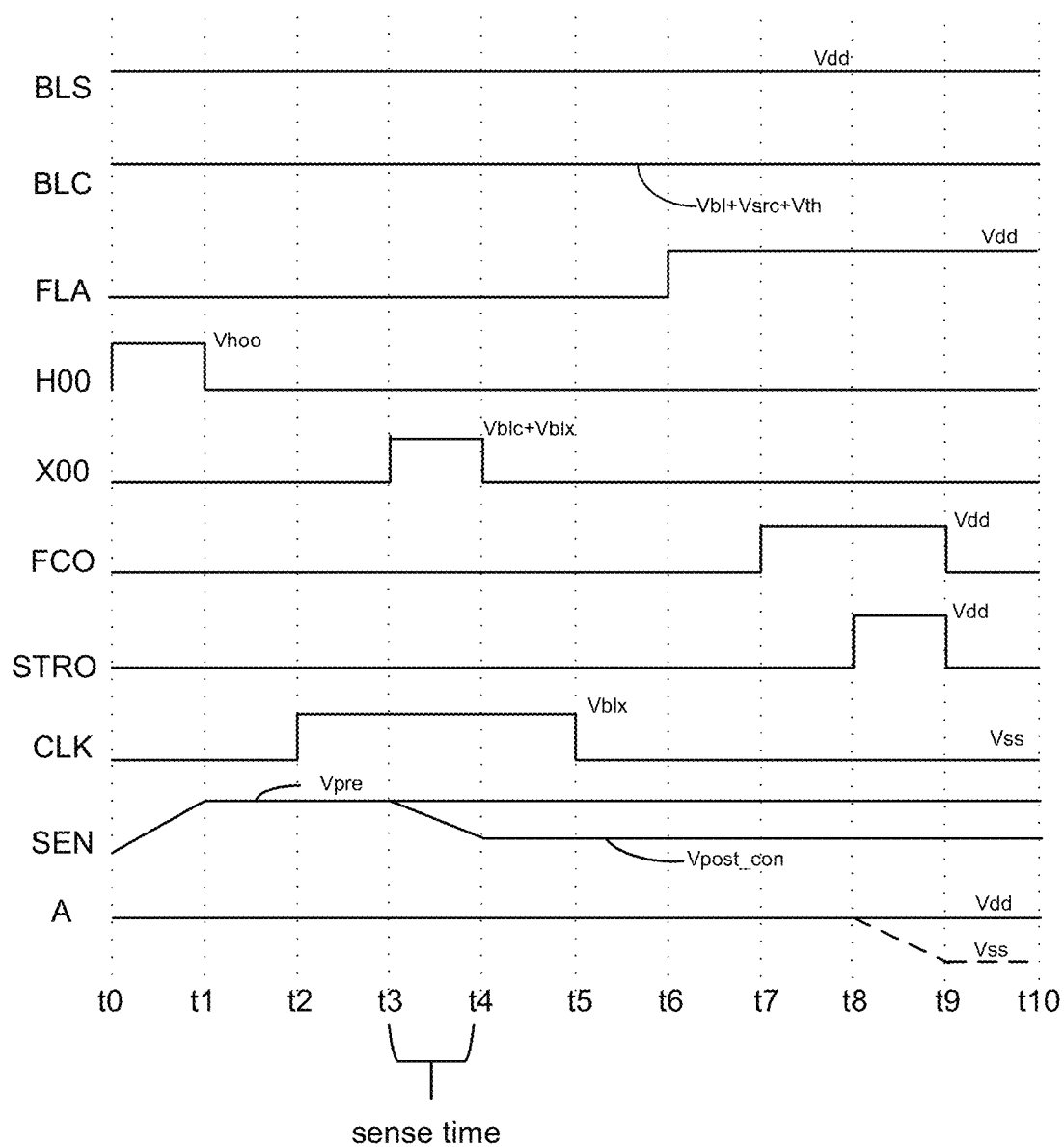
FIG. 8 is a timing diagram depicting example sense (read) operation of the sense amplifier of FIG. 7.

FIG. 8 is a timing diagram describing the behavior of various signals from FIG. 7 during a sensing operation (e.g., for reading or verifying). The signal BLS is at Vdd the entire time depicted. The signal BLC is at Vbl+Vsrc+Vth, where Vbl is the voltage of the Bit, Vsrc is the voltage of the source line and Vth is the threshold voltage of transistor 702. The signal FLA starts at Vss at t0 and goes to Vdd at t6. When the signal FLA is at Vss, the pre-charging path is regulated by transistor 710. At t0, the voltage of H00 is raised from ground to a pre-charge level. The raising of the voltage at H00 turns on transistor 710 and opens up the pre-charge path. The magnitude of the voltage at H00 is set. FIG. 8 shows H00 going to Vhoo. Note that in some embodiments, the circuit of FIG. 7 can respond to more than one voltage magnitude for H00. For example, in one embodiment, the output of the circuit of FIG. 7 is a linear function with respect to position of the memory cell being sensed so that there are many different possible voltage magnitudes for H00, depending on position of the memory cell being sensed. The signal H00 will stay at the pre-charge voltage (Vhoo) until time t1. While H00 is high, transistor 710 turns on and capacitor 716 will pre-charge between t0 and t1, as depicted by the voltage at SEN (depicted second from the bottom on FIG. 8). At time t1, H00 is brought down to Vss and the pre-charging is completed.

The signal X00 is used to allow capacitor 716 to be in communication with the Bit Line so that the capacitor can discharge through the Bit Line and the selected memory cell. At time t3, X00 is raised to Vblc+Vblx, where Vblx is the voltage of the signal BLX (both discussed above). At time t4, the voltage at X00 is lowered to Vss. Between times t3 and t4, known as the sense time, capacitor 716 will be in communication with the Bit Line in order to allow it to discharge through the Bit Line and the selected memory cell (depending on the threshold voltage of the selected memory cell). The signal CLK is raised to Vblx at time t2 and lowered back down to Vss at time t5 to prevent any fighting conditions in the circuit and to allow proper discharge of capacitor 716.

As discussed above, because H00 is raised between t0 and t1, capacitor 716 (and SEN node) will charge up between t0 and t1 (the pre-charge). This is depicted in FIG. 8 with the SEN node charging from Vss to Vpre. The solid line for Vpre represents an example pre-charging of the node SEN (and capacitor 716) in response to Vh00 being applied to the gate of transistor 710.

When X00 is raised up at t3, capacitor 716 can initially pre-charge the bit line and then discharge through the Bit Line (if the threshold voltage is at the appropriate level). As depicted in FIG. 8 between t3 and t4, the voltage at the SEN node can dissipate from Vpre to Vpost_con if the memory cell turns on (conducts) because its threshold voltage is less than or equal to the voltage being applied to its control gate. If the threshold voltage for the memory cell being tested is higher than the voltage applied to its control gate, capacitor 716 will not discharge and the voltage will remain at Vpre. The period between t3 and t4 is the sense time time and can be adjusted.

FIG. 8 shows that the signal FCO is raised to Vdd at t7 and lowered to Vss at t9. The signal STRO is raised to Vdd at t8 and lowered at t9. Between times t8 and t9, there is a path between the inverters 730, 732 and transistor 714. If the voltage at the node SEN is greater than the threshold voltage of transistor 714, then there will be a path from the inverters 730, 732 to CLK and the data at the inverters 730,732 will dissipate through the signal CLK and through the transistor 714. If the voltage at the node SEN is lower than threshold voltage of transistor 714 (e.g. if the capacitor discharged), then transistor 714 will turn off and the voltage stored by the inverters 730, 732 will not dissipate into CLK. FIG. 8 shows the voltage level at node A at Vdd. If the voltage of the capacitor does not dissipate (e.g., due to not enough current flowing because the threshold voltage of the selected memory cell is greater than the voltage being tested for), then transistor 714 will remain on and the voltage at node A will dissipate to Vss (as depicted by the dashed line). If the voltage of the capacitor does dissipate (e.g., due to sufficient current flowing because the threshold voltage of the selected memory cell is below the voltage being tested for), then transistor 714 will turn off and the voltage at node A will remain at Vdd (as depicted by the solid line). The output of node A is provided to the Data Out signal via transistor 734 by applying Vdd to the signal NCO.

As described by the process of FIG. 6, in one embodiment, non-volatile memory cells are programmed by applying a program signal (comprising program voltage pulses) to the memory cells in order to increase (or otherwise change) their threshold voltages so that the memory cells are in different threshold voltage distributions associated with different data states. FIGS. 5A-F provide examples of threshold voltage distributions associated with different data states. In order to reduce the number of (or prevent) errors when reading data stored in non-volatile memory cells, it is desirable that the threshold voltage distributions are narrow and separated from each other. Therefore, to decrease the width of threshold voltage distributions of programmed memory cells without unreasonably increasing the time needed to complete programming, it is proposed to use a zone based program speed adjustment.

Figure 9:
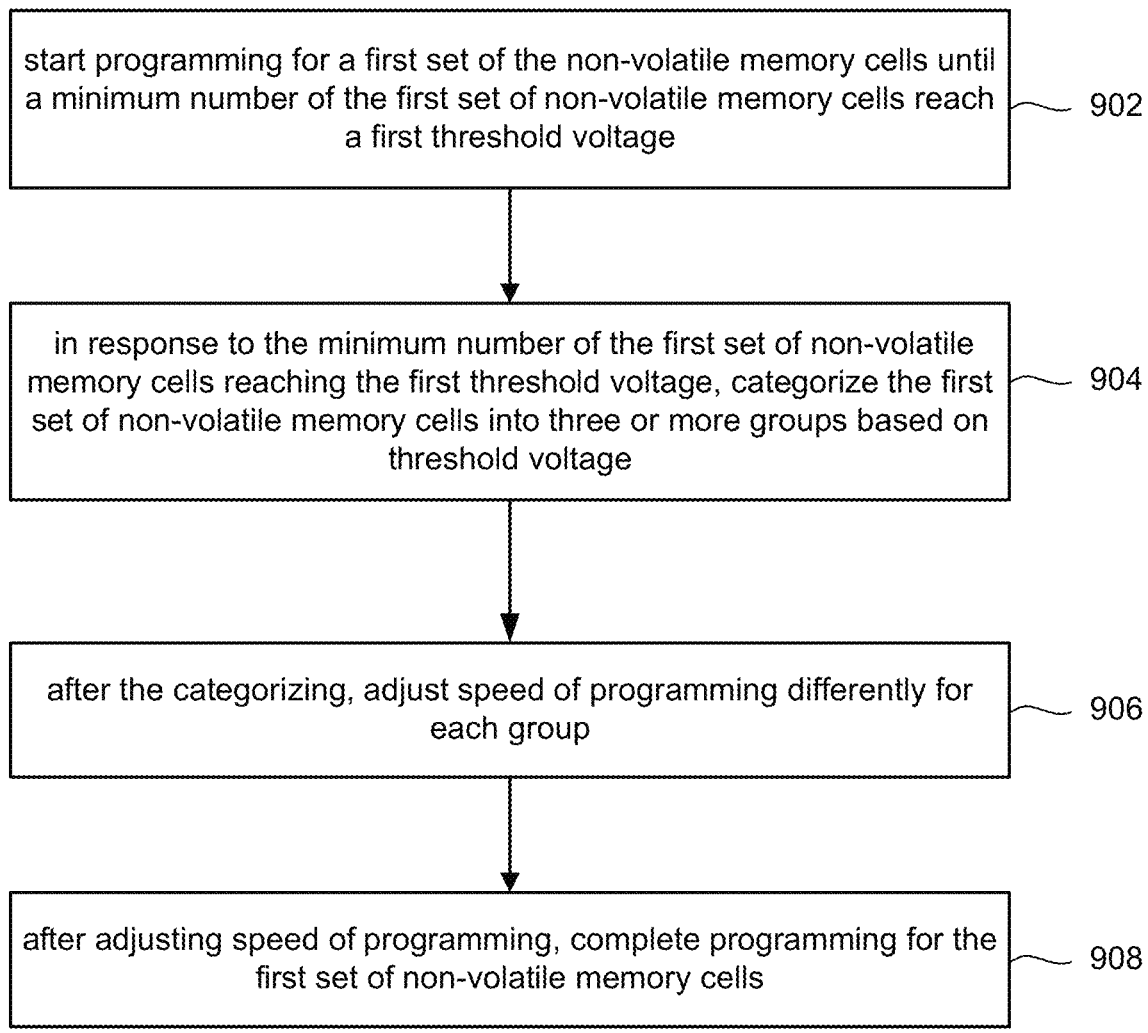
FIG. 9 is a flow chart describing one embodiment of a process for programming that uses zone based program speed adjustments.

FIG. 9 is a flow chart describing one embodiment of a process for programming that uses zone based program speed adjustments. In one example embodiment, the process of FIG. 9 is performed by any of the embodiments of a control circuit discussed above that is connected to a memory structure comprising non-volatile memory cells, multiple bit lines connected to the non-volatile memory cells and the control circuit, and word lines connected to the non-volatile memory cells and the control circuit (including a first word line connected to a first set of the non-volatile memory cells). In one example embodiment, the process of FIG. 9 is performed by integrated memory assembly 207 using any of the embodiments of a control circuit discussed above of control die 211 to program memory cells (e.g., NAND strings of memory structure 202) on memory die 201. In one embodiment, the process of FIG. 9 is performed at the direction of state machine 262 (or another processor).

In step 902 of FIG. 9, the control circuit starts programming for the first set of the non-volatile memory cells (connected to the first word line) until a minimum number of the first set of non-volatile memory cells reach a first threshold voltage. In one embodiment, the control circuit is configured to start programming for the first set of the non-volatile memory cells by applying a series of program voltage pulses to the first word line (as per the process of FIG. 6) until a minimum number of the first set of the non-volatile memory cells reach the first threshold voltage which is associated with a first data state (e.g., data states A, B, C, D, E, F or G of FIG. 5C). The minimum number tested for in step 902 may include a static number of memory cells (e.g., 25, 50, 100, etc.) or a percentage of memory cells being programmed to the first data state (e.g., 5%, 10%, 20%, etc.). For example, if the memory cells are being programmed to data state B of FIG. 5C, then one embodiment of step 902 may include performing the process of FIG. 6 until 100 of the memory cells are sensed (see e.g., step 610) to have threshold voltages above some predetermined voltage, where that predetermined voltage is less than VvB. More details are provided below.

Figure 10:
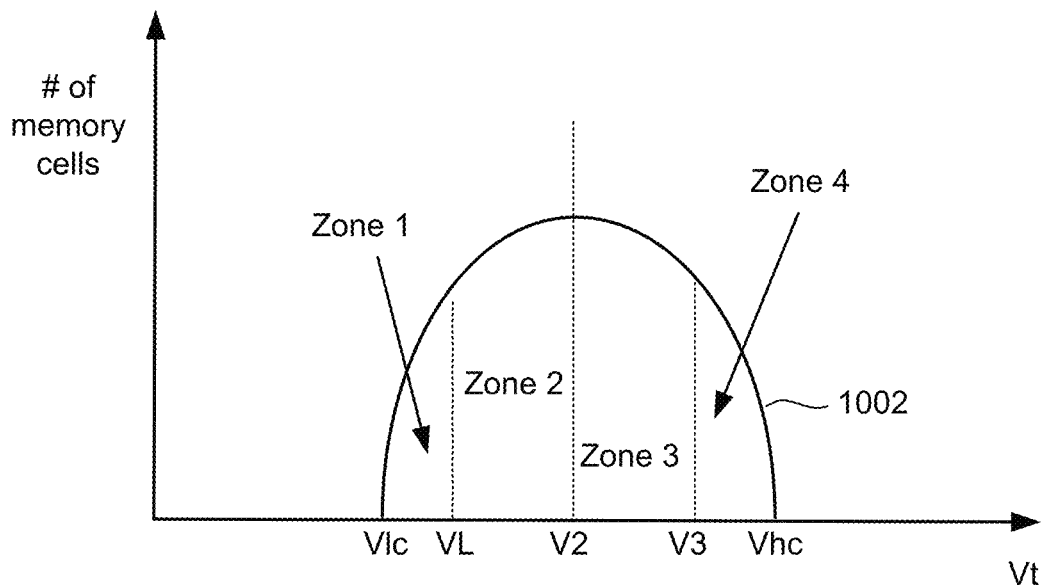
FIG. 10 depicts a threshold voltage distribution.

In step 904, in response to the minimum number of the first set of non-volatile memory cells reaching the first threshold voltage, the control circuit categorizes the first set of non-volatile memory cells into three or more groups based on threshold voltage. FIG. 10 depicts a threshold voltage distribution 1002 for the first set of non-volatile memory cells while the first set of non-volatile memory cells are being programmed (e.g., as per the process of FIG. 6). FIG. 10 describes one embodiment where the control circuit is configured to categorize the first set of non-volatile memory cells into four groups based on threshold voltage of each of the first set of non-volatile memory cells in relation to the threshold voltage distribution 1002 for the first set of non-volatile memory cells including a first group for slowest non-volatile memory cells, a second group for medium speed non-volatile memory cells, a third group for faster speed non-volatile memory cells, and a fourth group for fastest speed non-volatile memory cells. FIG. 10 shows five voltages associated with threshold voltage distribution 1002, including the minimum voltage Vlc for threshold voltage distribution 1002, the maximum voltage Vhc for threshold voltage distribution 1002, and there intermediate voltages VL, V2, and V3. In one embodiment the verify compare voltage for the data state that the memory cells are being programmed to (e.g., VvA for data state A of FIG. 5C) is above Vhc, but in other embodiments the verify compare voltage can be less than Vhc, equal to Vhc or equal to V3.

In one embodiment, step 902 of FIG. 9 includes testing whether each of the first set of non-volatile memory cells have threshold voltages greater than VL and determining whether more than the minimum number memory cells of the first set of non-volatile memory cells have threshold voltages greater than VL.

In one embodiment, step 904 of FIG. 9 includes sensing the memory cells to determine which of the memory cells have threshold voltages greater than V2 and which of the memory cells have threshold voltages greater than V3. In this manner, the threshold voltage distribution 1002 is divided into zones including a first zone for memory cells having threshold voltages less than VL, a second zone for memory cells having threshold voltages greater than or equal to VL and less than V2, a third zone for memory cells having threshold voltages greater than or equal to V2 and less than V3, and a fourth zone for memory cells having threshold voltages greater than or equal to V3. Step 904 includes categorizing the memory cells into zone 1, zone 2, zone 3 and zone 4. Those memory cells categorized into zone 1 are a first group for slowest non-volatile memory cells. Those memory cells categorized into zone 2 are a second group for medium speed non-volatile memory cells. Those memory cells categorized into zone 3 are a third group for faster speed non-volatile memory cells. Those memory cells categorized into zone 4 are a fourth group for fastest speed non-volatile memory cells. In other embodiments, more or less than four zones can be implemented.

Although FIG. 10 depicts four zones, other embodiments can include less than or more than four zones. In one embodiment, VL, V2 and V3 are static voltage magnitudes that do not change for a particular data state. In other embodiments, VL, V2 and V3 are dynamically chosen for each programming process or each loop of the programming process.

Figure 11:
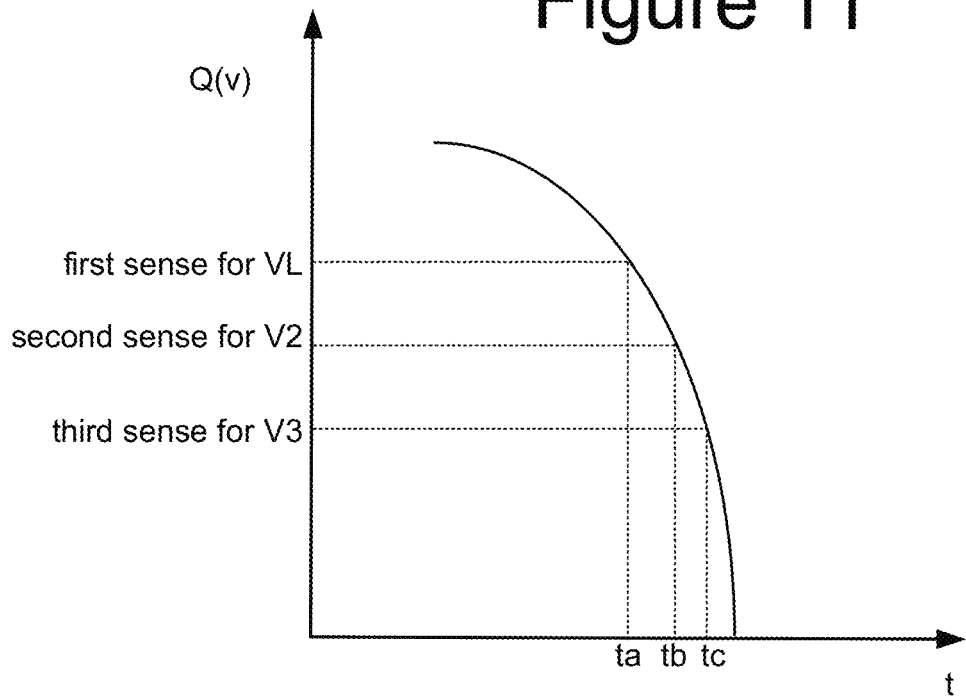
FIG. 11 is graph of time versus voltage for a capacitor in the sense amplifier.

In one embodiment, the control circuit is configured to categorize the first set of non-volatile memory cells into three or more groups based on threshold voltage by applying a single reference voltage to the first word line (which is connected to all of the memory cells being programmed and categorized) and sensing three times while applying the single reference voltage to the first word line in order to determine which of the first set of non-volatile memory cells have threshold voltages below VL, which of the first set of non-volatile memory cells have threshold voltages above the VL and below V2, which of the first set of non-volatile memory cells have threshold voltages above V2 and below V3, and which of the first set of non-volatile memory cells have threshold voltages above V3. For example, FIG. 11 shows a graph of time versus the voltage for capacitor 716 of the sense amplifier (see FIG. 7) on the control die performing the sensing. A longer sense time (e.g., between t3 and t4 of FIG. 8) can be used while applying, for example, V3 to the first word line (which is connected to all of the memory cells being programmed and categorized). Memory cells having threshold voltages below VL will dissipate the voltage on capacitor 716 quicker than memory cells having threshold voltages above VL, memory cells having threshold voltages below V2 will dissipate the voltage on capacitor 716 quicker than memory cells having threshold voltages above V2, and memory cells having threshold voltages below V3 will dissipate the voltage on capacitor 716 while memory cells having threshold voltages above V3 will not sufficiently dissipate the voltage on capacitor 716. Therefore, memory cells of zone 1 will dissipate the voltage on capacitor 716 faster than memory cells of zone 2, memory cells of zone 2 will dissipate the voltage on capacitor 716 faster than memory cells of zone 3, and memory cells of zone 4 will not sufficiently dissipate the voltage on capacitor 716. Sensing three times while applying the single reference voltage (e.g., V3) to the first word line can be performed by testing (first sense) for VL at a first time ta, testing (second sense) for V2 at a second time tb, and testing (third sense) for V3 at a third time tc, all within the sense time (e.g., between t3 and t4 of FIG. 8) and all while applying V3 to the common word line.

In step 906 of FIG. 9, after the categorizing of step 904, the control circuit adjusts speed of programming differently for each group. In another embodiment, only a subset of groups have their speed adjusted differently (e.g., some groups have no adjustment or multiple groups have the same adjustment).

In one example, the second-fourth groups (e.g., zone 2, zone 3 and zone 4) have their speed decreased from the nominal programming speed that would occur if there was no speed adjustment; however, the decrease in speed is different for each group, while the first group (zone 1) does not have its speed decreased from the nominal programming speed that would occur if there was no speed adjustment. This embodiment is described by FIG. 12A which shows a first example implementation of an alternative to step 906 of FIG. 9. In step 1202 of FIG. 12A, the control circuit applies a nominal bit line voltage to bit lines connected to the NAND strings with a selected memory cell in zone 1. In step 1204, the control circuit applies Vblc2 to bit lines connected to the NAND strings with a selected memory cell in zone 2. In step 1206, the control circuit applies Vblc3 to bit lines connected to the NAND strings with a selected memory cell in zone 3. In step 1208, the control circuit applies Vblc4 to bit lines connected to the NAND strings with a selected memory cell in zone 4. In one embodiment, Vblc4>Vblc3>Vblc2. In one embodiment, applying VDD (e.g., 3.5 volts) causes a memory cell to be inhibited from programming so VDD>Vblc4.

In one embodiment, the second-fourth groups (e.g., zone 2, zone 3 and zone 4) have their speed decreased from the nominal programming speed that would occur if there was no speed adjustment; however, the decrease in speed is different for each group, while the first group (zone 1) has its speed increased from the nominal programming speed that would occur if there was no speed adjustment by applying one or more negative bit line voltages to the memory cells of the first group. This embodiment is described by FIG. 12B which shows an example implementation of step 906 of FIG. 9. In step 1232 of FIG. 12B, the control circuit applies −Vbln (a negative bit line voltage) to bit lines connected to the NAND strings with a selected memory cell in zone 1. In step 1234, the control circuit applies Vblc2 to bit lines connected to the NAND strings with a selected memory cell in zone 2. In step 1236, the control circuit applies Vblc3 to bit lines connected to the NAND strings with a selected memory cell in zone 3. In step 1238, the control circuit applies Vblc4 to bit lines connected to the NAND strings with a selected memory cell in zone 4. In one embodiment, Vblc4=0.7v (or 0.5v), Vblc3=0.5v (or 0.3v), Vblc2=0.3v (or 0.1v) and −Vbln=−0.3v(or −0.5v). Other voltage magnitudes can also be used.

In one embodiment, the first-fourth groups (e.g., zone 1, zone 2, zone 3 and zone 4) have their speed decreased from the nominal programming speed that would occur if there was no speed adjustment; however, the decrease in speed is different for each group.

This embodiment is described by FIG. 12C which shows another example implementation of step 906 of FIG. 9. In step 12709 of FIG. 12C, the control circuit applies Vblc1 to bit lines connected to the NAND strings with a selected memory cell in zone 1. In step 1204, the control circuit applies Vblc2 to bit lines connected to the NAND strings with a selected memory cell in zone 2. In step 1206, the control circuit applies Vblc3 to bit lines connected to the NAND strings with a selected memory cell in zone 3. In step 1208, the control circuit applies Vblc4 to bit lines connected to the NAND strings with a selected memory cell in zone 4. In one embodiment, Vblc2>Vblc1 (e.g., Vblc1=01.v).

Looking back at FIG. 9, step 908 includes, after (or while) adjusting speed of programming, the control circuit completing programming for the first set of non-volatile memory cells. For example, additional loops of the process of FIG. 6 (or a process similar to FIG. 6) is performed. That is, in one embodiment, the control circuit is configured to complete programming for the first set of non-volatile memory cells by applying one or more additional program voltage pulses to the first word line to complete programming for the first set of non-volatile memory cells.

Note that in some embodiments, the process of FIG. 9 is performed concurrently or serially for all data states being programmed to. Thus, steps 902-908 are repeated for each data state.

FIG. 13 is a flow chart describing another embodiment of a process for programming that uses zone based program speed adjustments. In one example embodiment, the process of FIG. 13 is performed by any of the embodiments of a control circuit discussed above that is connected to a plurality of non-volatile memory cells. In one example embodiment, the process of FIG. 13 is performed by integrated memory assembly 207 using any of the embodiments of a control circuit discussed above of control die 211 to program memory cells (e.g., NAND strings of memory structure 202) on memory die 201. In one embodiment, the process of FIG. 13 is performed at the direction of state machine 262 (or another processor). The process of FIG. 13 is an example embodiment of the process of FIG. 9.

In step 1302 of FIG. 13, the control circuit applies program voltage pulses to a first set of non-volatile memory cells in order to program the first set of non-volatile memory cells. In step 1304, after starting the applying program voltage pulses and prior to completing the programming of the first set of non-volatile memory cells, the control circuit categorizes each of the first set of non-volatile memory cells into three or more zones based on threshold voltage of each of the first set of non-volatile memory cells in relation to a threshold voltage distribution for the first set of non-volatile memory cells including a first zone for slowest non-volatile memory cells, a second zone for medium speed non-volatile memory cells and a third zone for faster non-volatile memory cells. In one embodiment, the categorizing is performed as per FIG. 10. In one embodiment, the control circuit categorizes each of the first set of non-volatile memory cells into four or more zones based on threshold voltage, as per FIG. 10.

In step 1306, after the categorizing and prior to completing the programming of the first set of non-volatile memory cells, the control circuit increases the speed of programming for non-volatile memory cells categorized to be in the first zone. For example, the increasing speed of programming for non-volatile memory cells of the first zone comprises lowering bit line voltages to one or more negative voltages for bit lines connected to the non-volatile memory cells categorized to be in the first zone (see e.g., step 1232 of FIG. 12B). In step 1308, after the categorizing and prior to completing the programming of the first set of non-volatile memory cells, the control circuit decreases the speed of programming by a first amount for non-volatile memory cells categorized to be in the second zone. In step 1310, after the categorizing and prior to completing the programming of the first set of non-volatile memory cells, the control circuit decreases speed of programming by a second amount for non-volatile memory cells categorized to be in the third zone. In one embodiment, the control circuit categorizes each of the first set of non-volatile memory cells into four or more zones based on threshold voltage as per FIG. 10 and steps 1308 & 1310 include performing steps 1234-1238 of FIG. 12B. In step 1312, the control circuit completes the programming of the first set of non-volatile memory cells (using the adjustments to speed made in steps 1306-1310).

In one embodiment of the process of FIG. 13, after the categorizing of step 1304 the control circuit does not recategorize the first set of non-volatile memory cells into the three or more zones for the particular programming process.

In one embodiment of the process of FIG. 13, the control circuit recategorizes the first set of non-volatile memory cells into the three or more zones based on threshold voltage after applying the one or more addition program voltage pulses (after the initial categorizing). The recategorizing can occur multiple times (e.g., after every subsequent program voltage pulse or a subset of voltage program pulses)

Note that in one set of embodiments, the process of FIG. 13 is performed concurrently or serially for all data states being programmed to. Thus, steps 1302-1312 are repeated for each data state.

Figure 14:
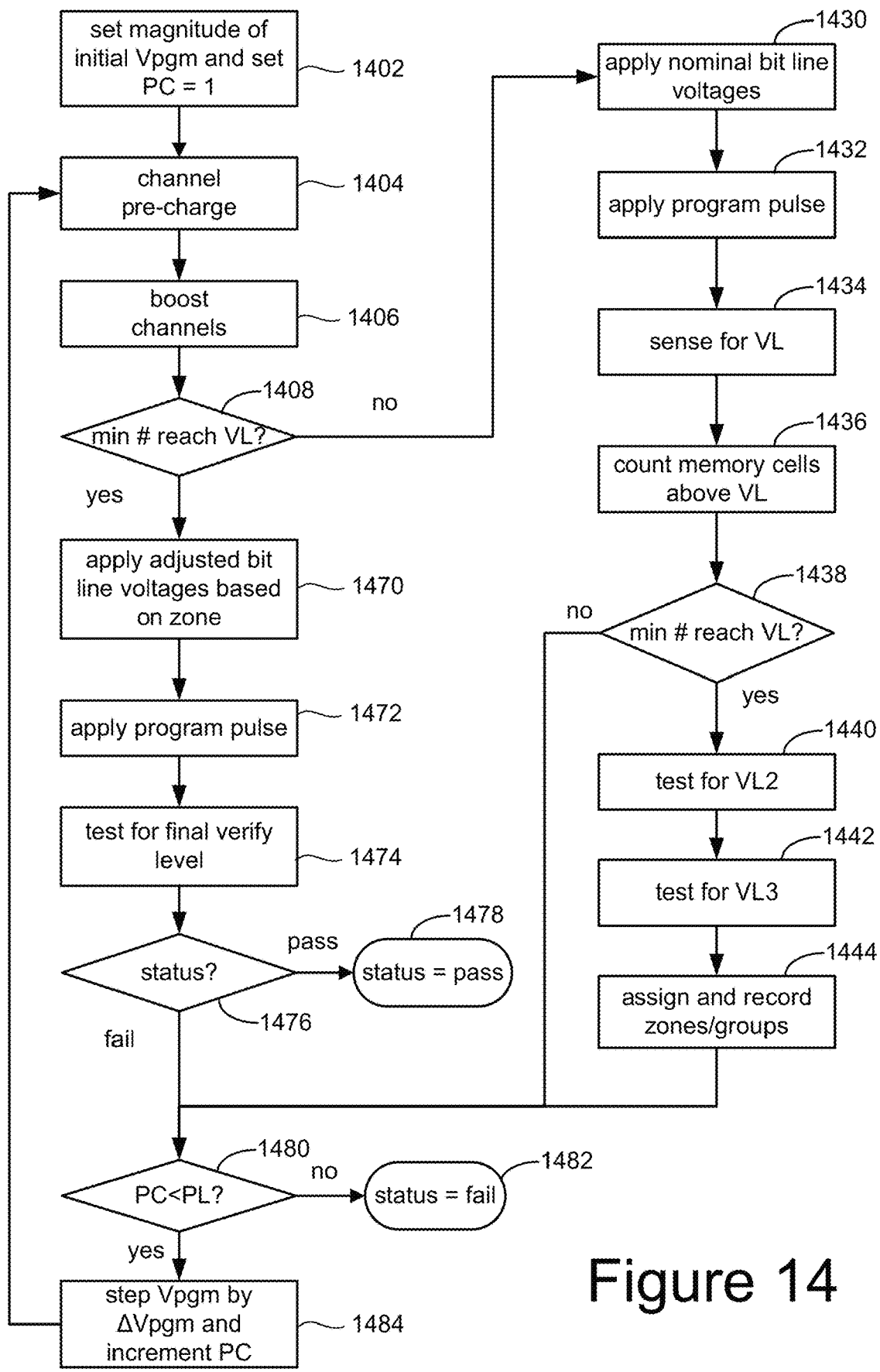
FIG. 14 is a flow chart describing one embodiment of a process for programming that uses a zone based program speed adjustment.

FIG. 14 is a flow chart describing one embodiment of a process for programming that uses zone based program speed adjustments. In one example embodiment, the process of FIG. 14 is performed by any of the embodiments of a control circuit discussed above that is connected to a memory structure comprising non-volatile memory cells, multiple bit lines connected to the non-volatile memory cells and the control circuit, and word lines connected to the non-volatile memory cells and the control circuit (including a first word line connected to the first set of the non-volatile memory cells). In one example embodiment, the process of FIG. 14 is performed by integrated memory assembly 207 using any of the embodiments of a control circuit discussed above of control die 211 to program memory cells (e.g., NAND strings of memory structure 202) on memory die 201. In one embodiment, the process of FIG. 14 is performed at the direction of state machine 262 (or another processor). In one embodiment, the process of FIG. 14 is an example implementation of the process of FIG. 9 and/or the process of FIG. 13.

In step 1402, the programming voltage signal (Vpgm) is initialized to the starting magnitude (e.g., ~12-16V or another suitable level) and the program counter PC is initialized at 1. In one embodiment, the group of memory cells selected to be programmed (referred to herein as the selected memory cells) are programmed concurrently and are all connected to the same word line (the selected word line). In step 1404, the control die pre-charges channels of NAND strings that include memory cells connected to the selected word line that are to be inhibited from programming. In step 1406, NAND strings that include memory cells connected to the selected word line that are to be inhibited from programming have their channels boosted to inhibit programming.

In step 1408, it is determined whether a minimum number of memory cells have threshold voltages equal to or greater than VL for the current data state being programmed. Steps 1402-1408 are an example implementation of step 902 of FIG. 9. If the number of memory cells that have threshold voltages equal to or greater than VL is not greater than the minimum number, then in step 1430 the control circuit applies the nominal bit line voltages (e.g., 0v for memory cells being programmed and VDD for memory cells being inhibited) to the memory cells. In step 1432, a program voltage pulse is applied to the memory cells being programmed (e.g., to their control gates) via the selected word line, as discussed above. In step 1434, the memory cells being programmed are sensed to determine whether they have threshold voltages equal to or greater than VL. If the number of memory cells that have threshold voltages equal to or greater than VL is still not greater than the minimum number, then the process continues at step 1480, during which the program counter PC is checked against the program limit value PL. If the program counter PC is not less than the program limit value PL, then the program process is considered to have failed and a status of FAIL is reported in step 1482. If the program counter PC is less than the program limit value PL, then the process continues at step 1484 during which time the program counter PC is incremented by 1 and the programming voltage signal Vpgm is stepped up to the next magnitude. For example, the next program voltage pulse will have a magnitude greater than the previous pulse by a step size ΔVpgm (e.g., a step size of 0.1-1.0 volts). After step 1482, the process loops back to step 1404 and another loop/iteration of the programming process of FIG. 14 is performed, including applying another program voltage pulse to the selected word line (e.g., by the control die).

If, in step 1438, it is determined that the number of memory cells that have threshold voltages equal to or greater than VL is greater than the minimum number, then the process continues at step 1440 and the control circuit senses the memory cells being programmed to determine whether they have threshold voltages equal to or greater than V2. In step 1442, the control circuits senses the memory cells being programmed to determine whether they have threshold voltages equal to or greater than V3. Based on knowing whether the memory cells have threshold voltages greater than VL, greater than V2 and greater than VL, the control circuit can categorize and assign the memory cells into zone 1 (group 1), zone 2 (group 2), zone 3 (group 3), and zone 4 (group 4) in step 1444. The categorization/assignments into zones/groups is recorded by the control circuit. In one embodiment, each sense amplifier (which is connected to a separate bit line) is connected to four (or more) data latches and two of those data latches (ach storing one bit) can be used to record a two bit number indicating the zone/group (00=zone/group 1, 01=zone/group 2, 10=zone/group 3, 11=zone/group 4). Steps 1434 and 1440-1444 are an example implementation of step 904 and/or step 1304. After assigning and recording the zones/groups in step 1444, the process continues at step 1480.

In one embodiment, steps 1434, 1440 and 1442 are performed separately (e.g., three separate sensing operations). In another embodiment, steps 1434, 1440 and 1442 are performed together, as per the discussion above with respect to FIG. 11, by applying a single reference voltage to the first word line (which is connected to all of the memory cells being programmed and categorized) and sensing three times while applying the single reference voltage to the first word line in order to determine which of the first set of non-volatile memory cells have threshold voltages below VL, which of the first set of non-volatile memory cells have threshold voltages above the VL and below V2, which of the first set of non-volatile memory cells have threshold voltages above V2 and below V3, and which of the first set of non-volatile memory cells have threshold voltages above V3.

If, in step 1408, it is determined that the number of memory cells that have threshold voltages equal to or greater than VL is greater than the minimum number (based on previous performance of steps 1434, 1440 and 1442 during a previous loop), then the process continues at step 1470 and the control circuit applies adjusted bit line voltages based on the zone/group assigned and recorded for the memory cells from a previous performance of step 1444. In one embodiment, step 1470 includes performing any of the processes of FIGS. 12A-C. Step 1470 is an example implementation of step 906 and/or steps 1306/1308/1310. In step 1472, a program voltage pulse is applied (e.g., part of implementing step 908).

In step 1474, the control circuit performs program verification for the final verify level for the data state, which is the verify compare voltage for the data state being programmed to. For example, if the memory cells are being programmed to data state D of FIG. 5C, the step 1474 tests for whether the memory cells have threshold voltages equal to or greater than VvD.

In step 1476, it is determined whether all (or a sufficient number) of the memory cells have reached their target threshold voltages—the final verify level tested for in step 1474. If so, then the programming process is complete and successful because all (or a sufficient number of) selected memory cells were programmed and verified to their target states. A status of "PASS" is reported in step 1478. Otherwise, if in step 1476, it is determined that not all of the memory cells have reached their target threshold voltages (fail), and the programming process continues at step 1480. In one embodiment, the control circuit may determine that the programming process is complete and successful because enough memory cells were programmed and verified to their target states; for example, if the number of memory cells not verified successfully is smaller (or much smaller) than the capacity of the error correction scheme to fix errors during the read process then the programming process is considered complete and successful.

Note that in one set of embodiments, the process of FIG. 14 is performed concurrently or serially for all data states being programmed to. Thus, steps 1402-1484 are repeated for each data state.

Note that in the process of FIG. 14, the memory cells being programmed are only categorized into zones/groups once.

Figure 15:
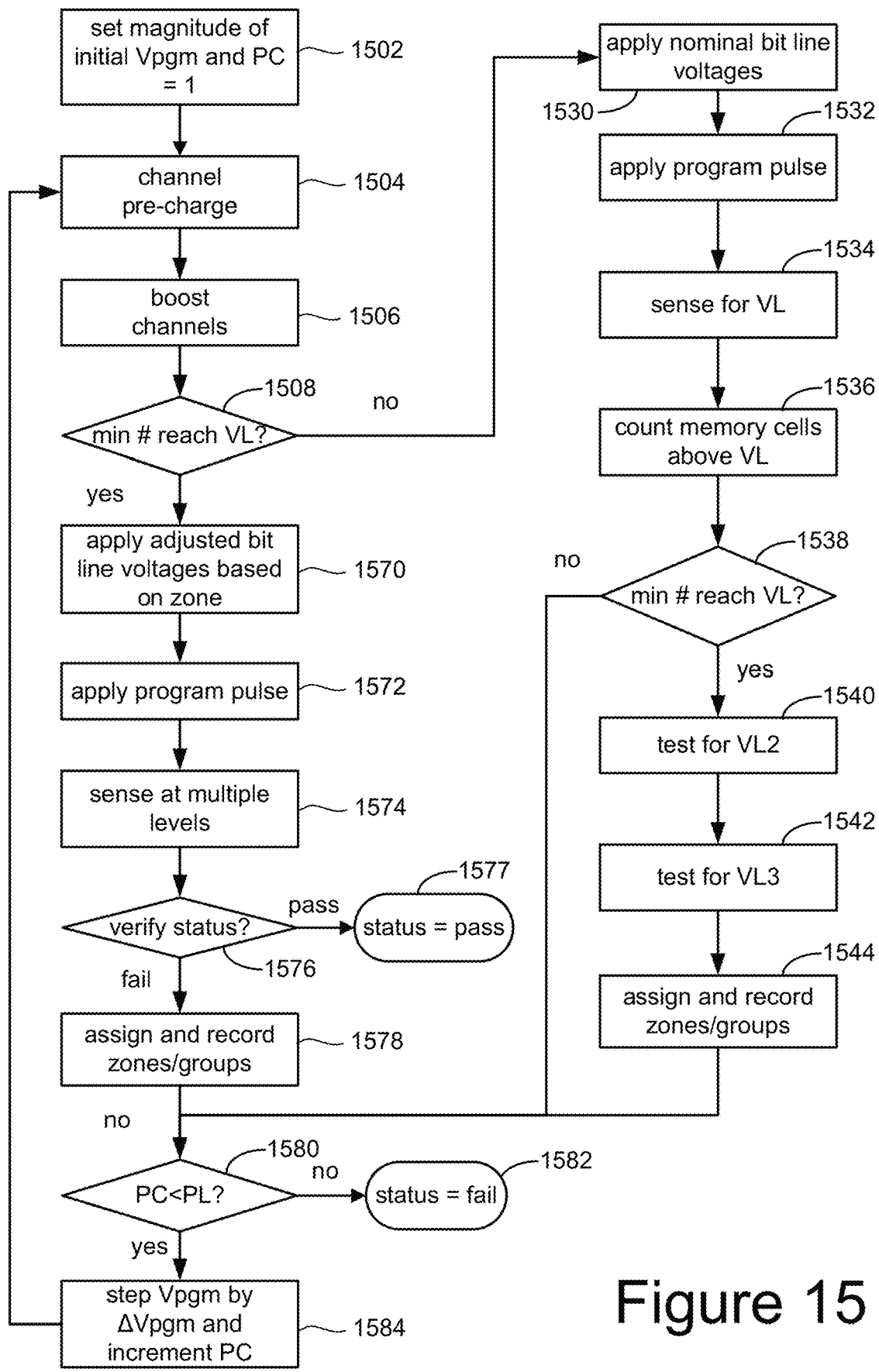
FIG. 15 is a flow chart describing one embodiment of a process for programming that uses a zone based program speed adjustment.

FIG. 15 is a flow chart describing one embodiment of a process for programming that uses zone based program speed adjustments. In one example embodiment, the process of FIG. 15 is performed by any of the embodiments of a control circuit discussed above that is connected to a memory structure comprising non-volatile memory cells, multiple bit lines connected to the non-volatile memory cells and the control circuit, and word lines connected to the non-volatile memory cells and the control circuit (including a first word line connected to the first set of the non-volatile memory cells). In one example embodiment, the process of FIG. 15 is performed by integrated memory assembly 207 using any of the embodiments of a control circuit discussed above of control die 211 to program memory cells (e.g., NAND strings of memory structure 202) on memory die 201. In one embodiment, the process of FIG. 15 is performed at the direction of state machine 262 (or another processor). In one embodiment, the process of FIG. 15 is an example implementation of the process of FIG. 9 and/or the process of FIG. 13.

In step 1502, the programming voltage signal (Vpgm) is initialized to the starting magnitude (e.g., ~12-16V or another suitable level) and the program counter PC is initialized at 1. In one embodiment, the group of memory cells selected to be programmed (referred to herein as the selected memory cells) are programmed concurrently and are all connected to the same word line (the selected word line). In step 1504, the control die will pre-charge channels of NAND strings that include memory cells connected to the selected word line that are to be inhibited from programming. In step 1506, NAND strings that include memory cells connected to the selected word line that are to be inhibited from programming have their channels boosted to inhibit programming.

In step 1508, it is determined whether a minimum number of memory cells have reach VL for the current data state being programmed. Steps 1502-1508 are an example implementation of step 902 of FIG. 9. If the number of memory cells that have threshold voltages equal to or greater than VL is not greater than the minimum number, then in step 1530 the control circuit applies the nominal bit line voltages (e.g., 0v for memory cells being programmed and VDD for memory cells being inhibited) to the memory cells. In step 1532, a program voltage pulse is applied to the memory cells being programmed (e.g., to their control gates) via the selected word line, as discussed above. In step 1534, the memory cells being programmed are sensed to determine whether they have threshold voltages equal to or greater than VL. If the number of memory cells that have threshold voltages equal to or greater than VL is still not greater than the minimum number, then the process continues at step 1580, during which the program counter PC is checked against the program limit value PL. If the program counter PC is not less than the program limit value PL, then the program process is considered to have failed and a status of FAIL is reported in step 1582. If the program counter PC is less than the program limit value PL, then the process continues at step 1584 during which time the program counter PC is incremented by 1 and the programming voltage signal Vpgm is stepped up to the next magnitude. For example, the next program voltage pulse will have a magnitude greater than the previous pulse by a step size ΔVpgm (e.g., a step size of 0.1-1.0 volts). After step 1584, the process loops back to step 1504 and another loop/iteration of the programming process of FIG. 15 is performed, including applying another program voltage pulse to the selected word line (by the control die).

If, in step 1538, it is determined that the number of memory cells that have threshold voltages equal to or greater than VL is greater than the minimum number, then the process continues at step 1540 and the control circuit senses the memory cells being programmed to determine whether they have threshold voltages equal to or greater than V2. In step 1452, the control circuits senses the memory cells being programmed to determine whether they have threshold voltages equal to or greater than V3. Based on knowing whether the memory cells have threshold voltages greater than VL, greater than V2 and greater than VL, the control circuit can categorize and assign the memory cells into zone 1 (group 1), zone 2 (group 2), zone 3 (group 3), and zone 4 (group 4) in step 1544. The categorization/assignments into zones/groups is recorded by the control circuit (e.g., as discussed above with respect to step 1444). After assigning and recording the zones/groups in step 1544, the process continues at step 1580.

In one embodiment, steps 1534, 1540 and 1542 are performed separately (e.g., three separate sensing operations). In another embodiment, steps 1534, 1540 and 1542 are performed together, as per the discussion above with respect to FIG. 11, by applying a single reference voltage to the first word line (which is connected to all of the memory cells being programmed and categorized) and sensing three times while applying the single reference voltage to the first word line in order to determine which of the first set of non-volatile memory cells have threshold voltages below VL, which of the first set of non-volatile memory cells have threshold voltages above the VL and below V2, which of the first set of non-volatile memory cells have threshold voltages above V2 and below V3, and which of the first set of non-volatile memory cells have threshold voltages above V3.

If, in step 1508, it is determined that the number of memory cells that have threshold voltages equal to or greater than VL is greater than the minimum number (based on previous performance of steps 1534, 1540 and 1542 during a previous loop), then the process continues at step 1570 and the control circuit applies adjusted bit line voltages based on the zone/group assigned and recorded for the memory cells from a previous performance of step 1544. In one embodiment, step 1570 includes performing any of the processes of FIGS. 12A-C. Step 1570 is an example implementation of step 906 and/or steps 1306/1308/1310. In step 1572, a program voltage pulse is applied (e.g., part of implementing step 908).

In step 1574, the control circuit performs program verification at multiple threshold voltage levels. For example, in one embodiment the control circuits senses the memory cells to test whether the memory cells have threshold voltages greater than VL, VL2 and VL3. In another embodiment, the control circuits senses the memory cells to test whether the memory cells have threshold voltages greater than VL, VL2, VL3 and the final verify level (e.g., VvD). In one embodiment, the sensing at the multiple levels are performed separately (e.g., three or four separate sensing operations). In another embodiment, the sensing at the multiple levels are performed together, as per the discussion above with respect to FIG. 11, by applying a single reference voltage to the first word line (which is connected to all of the memory cells being programmed and categorized) and sensing three (or four) times while applying the single reference voltage to the first word line in order to determine which of the first set of non-volatile memory cells have threshold voltages below VL, which of the first set of non-volatile memory cells have threshold voltages above the VL and below V2, which of the first set of non-volatile memory cells have threshold voltages above V2 and below V3, and which of the first set of non-volatile memory cells have threshold voltages above V3. Step 1474 includes recategorizing the memory cells into zone 1/group 1, zone 2/group 2, zone 3/group 3, and zone 4/group 4.

In step 1576, it is determined whether all (or a sufficient number) of the memory cells have reached their target threshold voltages—the final verify level. If so, then the programming process is complete and successful because all selected memory cells were programmed and verified to their target states. A status of "PASS" is reported in step 1577. Otherwise, if in step 1576, it is determined that not all of the memory cells have reached their target threshold voltages (fail), then the programming process continues at step 1578 and the zones/groups are re-assigned based on the sensing of step 1574 and recorded in the data latches, as discussed above. Thus, the process of FIG. 15 recategorizes the memory cells into zones/groups at each loop (e.g., the loop includes steps 1504, 1506, 1570, 1572, 1574, 1576, 1578,1580 and 1584).

Note that in one set of embodiments, the process of FIG. 14 is performed concurrently or serially for all data states being programmed to. Thus, steps 1402-1484 are repeated for each data state.

In order to decrease the width of threshold voltage distributions of programmed memory cells without unreasonably increasing the time needed to complete programming, a non-volatile memory has been disclosed that uses a zone based program speed adjustment.

One embodiment includes a non-volatile storage apparatus comprising a plurality of non-volatile memory cells and a control circuit connected to the non-volatile memory cells. The control circuit is configured to start programming for a first set of the non-volatile memory cells until a minimum number of the first set of non-volatile memory cells reach a first threshold voltage; in response to the minimum number of the first set of non-volatile memory cells reaching the first threshold voltage, categorize the first set of non-volatile memory cells into three or more groups based on threshold voltage; after the categorizing, adjust speed of programming differently for each group of the groups; and after adjusting speed of programming, complete programming for the first set of non-volatile memory cells.

One embodiment includes a method of operating a non-volatile storage apparatus, comprising: applying program voltage pulses to a first set of non-volatile memory cells in order to program the first set of non-volatile memory cells; after starting the applying program voltage pulses and prior to completing the programming of the first set of non-volatile memory cells, categorizing each of the first set of non-volatile memory cells into three or more zones based on threshold voltage of each of the first set of non-volatile memory cells in relation to a threshold voltage distribution for the first set of non-volatile memory cells including a first zone for slowest non-volatile memory cells, a second zone for medium speed non-volatile memory cells and a third zone for faster non-volatile memory cells; after the categorizing and prior to completing the programming of the first set of non-volatile memory cells, increasing speed of programming for non-volatile memory cells categorized to be in the first zone; after the categorizing and prior to completing the programming of the first set of non-volatile memory cells, decreasing speed of programming by a first amount for non-volatile memory cells categorized to be in the second zone; after the categorizing and prior to completing the programming of the first set of non-volatile memory cells, decreasing speed of programming by a second amount for non-volatile memory cells categorized to be in the third zone; and completing the programming of the first set of non-volatile memory cells.

One embodiment includes a non-volatile storage apparatus comprising a memory structure comprising non-volatile memory cells, bit lines connected to the non-volatile memory cells and word lines connected to the non-volatile memory cells; and a control circuit connected to the bit lines and the word lines. The control circuit is configured to apply a series of program voltage pulses to a first word line connected to a first set of the non-volatile memory cells until a minimum number of the non-volatile memory cells reach a first threshold voltage associated with a first data state; after the minimum number of the first set of non-volatile memory cells reach the first threshold voltage, categorize the first set of non-volatile memory cells by applying a single reference voltage to the first word line and sensing three times while applying the single reference voltage to the first word line in order to determine which of the first set of non-volatile memory cells have threshold voltages below a first value, which of the first set of non-volatile memory cells have threshold voltages above the first value and below a second value, which of the first set of non-volatile memory cells have threshold voltages above the second value and below a third value, and which of the first set of non-volatile memory cells have threshold voltages above the third value; adjust speed of programming for at least a subset of the first set of non-volatile memory cells by lowering bit line voltages to one or more negative voltages for bit lines connected to the non-volatile memory cells determined to have threshold voltages below the first value, increasing bit line voltages by a first amount for bit lines connected to the volatile memory cells that have threshold voltages above the second value and below the third value, increasing bit line voltages by a second amount for bit lines connected to the non-volatile memory cells that have threshold voltages above the third value such that the second amount is larger than the first amount; and after adjusting speed of programming, apply one or more additional program voltage pulses to the first word line to complete programming for the first set of non-volatile memory cells.

In one example implementation, the memory structure comprises vertical NAND strings, each non-volatile memory cell of the first set of non-volatile memory cells is positioned on a different vertical NAND string that is connected to the first word line, and the control circuit is configured to categorize the first set of non-volatile memory cells based on threshold voltage of each of the first set of non-volatile memory cells in relation to a threshold voltage distribution for the first set of non-volatile memory cells.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   a plurality of non-volatile memory cells;
   a word line, each of a first set of the non-volatile memory cells are connected to the word line; and
   a control circuit connected to the non-volatile memory cells and the word line, the control circuit is configured to:
   start programming for the first set of the non-volatile memory cells until a minimum number of the first set of the non-volatile memory cells reach a first threshold voltage, including sensing the first set of the non-volatile memory cells to determine whether the first set of the non-volatile memory cells have threshold voltages at least as high as the first threshold voltage and determining whether the minimum number of the first set of non-volatile memory cells reach a first threshold voltage, in response to determining that the minimum number of the first set of the non-volatile memory cells have reached the first threshold voltage, categorize the first set of the non-volatile memory cells into three or more groups based on threshold voltage and adjust speed of programming differently for each group of the groups such that the determining that the minimum number of the first set of the non-volatile memory cells have reached the first threshold voltage and the adjusting speed is performed after starting programming for each group and prior to completing programming for each group, and after adjusting speed of programming, complete programming for the first set of non-volatile memory cells by concurrently programming each group of the three or more groups at different programming speeds;

the categorizing comprises applying a single reference voltage to the word line and sensing at least two times while applying the single reference voltage to the word line in order to determine which of the first set of the non-volatile memory cells have threshold voltages below a first value, which of the first set of the non-volatile memory cells have threshold voltages above the first value and below a second value, and which of the first set of non-volatile memory cells have threshold voltages above the second value.

2. The non-volatile storage apparatus of claim 1, wherein:
the non-volatile storage apparatus further comprises multiple bit lines connected to the first set of the non-volatile memory cells and the control circuit; and
the adjusting speed of programming includes lowering bit line voltages to one or more negative voltages for bit lines connected to the non-volatile memory cells determined to be in a group of non-volatile memory cells having slowest program speeds.

3. The non-volatile storage apparatus of claim 1, wherein:
the control circuit is configured to categorize the first set of the non-volatile memory cells into four groups including a first group for slowest non-volatile memory cells, a second group for medium speed non-volatile memory cells, a third group for faster speed non-volatile memory cells, and a fourth group for fastest speed non-volatile memory cells;
the control circuit is configured to adjust speed of programming by increasing speed of programming for non-volatile memory cells of the first group, decreasing speed of programming by a first amount for non-volatile memory cells of the second group, decreasing speed of programming by a second amount for non-volatile memory cells of the third group and decreasing speed of programming by a third amount for non-volatile memory cells of the fourth group; and
the third amount is greater than the second amount and the second amount is greater than the first amount.

4. The non-volatile storage apparatus of claim 1, wherein:
the control circuit is configured to categorize the first set of the non-volatile memory cells into three or more groups based on threshold voltage by categorizing each of the first set of the non-volatile memory cells into four groups based on threshold voltage of each of the first set of the non-volatile memory cells in relation to a threshold voltage distribution for the first set of the non-volatile memory cells including a first group for slowest non-volatile memory cells, a second group for medium speed non-volatile memory cells, a third group for faster speed non-volatile memory cells, and a fourth group for fastest speed non-volatile memory cells.

5. The non-volatile storage apparatus of claim 1, wherein:
the control circuit is configured to categorize the first set of the non-volatile memory cells into three or more groups based on threshold voltage by categorizing each of the first set of the non-volatile memory cells into four groups based on threshold voltage of each of the first set of the non-volatile memory cells in relation to a threshold voltage distribution for the first set of non-volatile memory cells including a first group for slowest non-volatile memory cells, a second group for medium speed non-volatile memory cells, a third group for faster speed non-volatile memory cells, and a fourth group for fastest speed non-volatile memory cells;
the control circuit is configured to adjust speed of programming by increasing speed of programming for non-volatile memory cells of the first group, decreasing speed of programming by a first amount for non-volatile memory cells of the second group, decreasing speed of programming by a second amount for non-volatile memory cells of the third group and decreasing speed of programming by a third amount for non-volatile memory cells of the fourth group; and
the third amount is greater than the second amount and the second amount is greater than the first amount.

6. The non-volatile storage apparatus of claim 1, wherein:
the control circuit is configured to start programming for the first set of the non-volatile memory cells by applying a series of program voltage pulses to the word line until a minimum number of the first set of the non-volatile memory cells reach the first threshold voltage which is associated with a first data state; and
the control circuit is configured to complete programming for the first set of non-volatile memory cells by applying one or more additional program voltage pulses to the word line to complete programming for the first set of non-volatile memory cells.

7. The non-volatile storage apparatus of claim 1, wherein:
the non-volatile storage apparatus further comprises multiple bit lines connected to the first set of the non-volatile memory cells and the control circuit;
the control circuit is configured to categorize the first set of the non-volatile memory cells by determining which of the first set of the non-volatile memory cells have threshold voltages below a first value, which of the first set of the non-volatile memory cells have threshold voltages above the first value and below a second value, which of the first set of the non-volatile memory cells have threshold voltages above the second value and below a third value, and which of the first set of the non-volatile memory cells have threshold voltages above the third value;
the control circuit is configured to adjust speed of programming by lowering bit line voltages to one or more negative voltages for bit lines connected to the non-volatile memory cells determined to have threshold voltages below the first value, increasing bit line voltages by a first amount for bit lines connected to the volatile memory cells that have threshold voltages above the second value and below the third value, increasing bit line voltages by a second amount for bit lines connected to the non-volatile memory cells that have threshold voltages above the third value such that the second amount is larger than the first amount.

8. The non-volatile storage apparatus of claim 1, wherein:
the control circuit is configured to start programming for the first set of the non-volatile memory cells by applying a series of program voltage pulses to the word line until a minimum number of the first set of the non-volatile memory cells reach the first threshold voltage which is associated with a first data state;
the control circuit is configured to apply one or more addition program voltage pulses to the word line after the adjusting speed; and
the control circuit is configured to recategorize the first set of the non-volatile memory cells into the three or more groups based on threshold voltage after applying the one or more addition program voltage pulses.

9. The non-volatile storage apparatus of claim 1, wherein:
after the categorizing, the control circuit does not recategorize the first set of the non-volatile memory cells into the three or more groups.

10. A method of operating a non-volatile storage apparatus, comprising:
applying program voltage pulses to a first set of non-volatile memory cells in order to program the first set of non-volatile memory cells;
after starting the applying program voltage pulses and prior to completing the programming of the first set of non-volatile memory cells, categorizing each of the first set of non-volatile memory cells into three or more zones based on threshold voltage of each of the first set of non-volatile memory cells in relation to a threshold voltage distribution for the first set of non-volatile memory cells including a first zone for slowest non-volatile memory cells, a second zone for medium speed non-volatile memory cells and a third zone for faster non-volatile memory cells; the categorizing comprises applying a single reference voltage to a word line connected to the first set of non-volatile memory cells and sensing at least two times while applying the single reference voltage to the word line in order to determine which of the first set of non-volatile memory cells have threshold voltages below a first value, which of the first set of non-volatile memory cells have threshold voltages above the first value and below a second value, and which of the first set of non-volatile memory cells have threshold voltages above the second value;
after the categorizing and prior to completing the programming of the first set of non-volatile memory cells, increasing speed of programming for non-volatile memory cells categorized to be in the first zone;
after the categorizing and prior to completing the programming of the first set of non-volatile memory cells, decreasing speed of programming by a first amount for non-volatile memory cells categorized to be in the second zone;
after the categorizing and prior to completing the programming of the first set of non-volatile memory cells, decreasing speed of programming by a second amount for non-volatile memory cells categorized to be in the third zone; and
completing the programming of the first set of non-volatile memory cells.

11. The method of claim 10, wherein:
the increasing speed of programming for non-volatile memory cells of the first zone comprises lowering bit line voltages to one or more negative voltages for bit lines connected to the non-volatile memory cells categorized to be in the first zone.

12. The method of claim 10, further comprising:
recategorizing the first set of non-volatile memory cells into the three or more zones based on threshold voltage after applying the one or more addition program voltage pulses after the categorizing.

13. The method of claim 10, wherein:
the applying program voltage pulses, categorizing, increasing speed of programming for non-volatile memory cells of the first zone, decreasing speed of programming by the first amount for non-volatile memory cells of the second zone, and decreasing speed of programming by the second amount for non-volatile memory cells of the third zone are performed for a first data state; and
the applying program voltage pulses, categorizing, increasing speed of programming for non-volatile memory cells of the first zone, decreasing speed of programming by the first amount for non-volatile memory cells of the second zone, and decreasing speed of programming by the second amount for non-volatile memory cells of the third zone are repeated for a second set of non-volatile memory cells and a second data state.

14. The method of claim 10, wherein:
the first set of non-volatile memory cells are positioned on a memory die that is directly bonded to a control die, the memory die is separate from the control die;
the control die comprises sense amplifiers;
the applying program voltage pulses, categorizing, increasing speed of programming for non-volatile memory cells of the first zone, decreasing speed of programming by the first amount for non-volatile memory cells of the second zone, and decreasing speed of programming by the second amount for non-volatile memory cells of the third zone are performed by the control die; and
the sense amplifiers on the control die are used to perform the categorizing.

15. A non-volatile storage apparatus, comprising:
a memory structure comprising non-volatile memory cells, bit lines connected to the non-volatile memory cells and word lines connected to the non-volatile memory cells; and
a control circuit connected to the bit lines and the word lines, the control circuit is configured to:
apply a series of program voltage pulses to a first word line connected to a first set of the non-volatile memory cells until a minimum number of the non-volatile memory cells reach a first threshold voltage associated with a first data state,
after the minimum number of the first set of non-volatile memory cells reach the first threshold voltage, categorize the first set of non-volatile memory cells by applying a single reference voltage to the first word line and sensing three times while applying the single reference voltage to the first word line in order to determine which of the first set of non-volatile memory cells have threshold voltages below a first value, which of the first set of non-volatile memory cells have threshold voltages above the first value and below a second value, which of the first set of non-volatile memory cells have threshold voltages above the second value and below a third value, and which of the first set of non-volatile memory cells have threshold voltages above the third value, adjust speed of programming for at least a subset of the first set of non-volatile memory cells by lowering bit line voltages to one or more negative voltages for bit lines connected to the non-volatile memory cells determined to have threshold voltages below the first value, increasing bit line voltages by a first amount for bit lines connected to the volatile memory cells that have threshold voltages above the second value and below the third value, increasing bit line voltages by a second amount for bit lines connected to the non-volatile memory cells that have threshold voltages above the third value such that the second amount is larger than the first amount, and after adjusting speed of programming, apply one or more additional program voltage pulses to the first word line to complete programming for the first set of non-volatile memory cells.

16. The non-volatile storage apparatus of claim 15, wherein:

the memory structure comprises vertical NAND strings; and each non-volatile memory cell of the first set of non-volatile memory cells is positioned on a different vertical NAND string that is connected to the first word line.

17. The non-volatile storage apparatus of claim 15, wherein:

the control circuit is configured to categorize the first set of non-volatile memory cells based on threshold voltage of each of the first set of non-volatile memory cells in relation to a threshold voltage distribution for the first set of non-volatile memory cells.

* * * * *